US010854620B2

(12) United States Patent
Mori et al.

(10) Patent No.: US 10,854,620 B2
(45) Date of Patent: Dec. 1, 2020

(54) SEMICONDUCTOR MEMORY DEVICE

(71) Applicant: Toshiba Memory Corporation, Minato-ku (JP)

(72) Inventors: Takeo Mori, Yokkaichi (JP); Takashi Terada, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/551,022

(22) Filed: Aug. 26, 2019

(65) Prior Publication Data

US 2020/0295020 A1 Sep. 17, 2020

(30) Foreign Application Priority Data

Mar. 15, 2019 (JP) ................................. 2019-048690

(51) Int. Cl.

| | |
|---|---|
| ***H01L 27/11556*** | (2017.01) |
| ***H01L 27/11582*** | (2017.01) |
| ***H01L 27/11524*** | (2017.01) |
| ***G11C 5/06*** | (2006.01) |
| ***G11C 16/04*** | (2006.01) |
| ***H01L 27/1157*** | (2017.01) |

(52) U.S. Cl.

CPC .......... *H01L 27/11556* (2013.01); *G11C 5/06* (2013.01); *G11C 16/0441* (2013.01); *G11C 16/0466* (2013.01); *H01L 27/1157* (2013.01); *H01L 27/11524* (2013.01); *H01L 27/11582* (2013.01)

(58) Field of Classification Search

None

See application file for complete search history.

(56) References Cited

U.S. PATENT DOCUMENTS

| | | | |
|---|---|---|---|
| 9,780,111 | B2 | 10/2017 | Ishizaki et al. |
| 9,984,963 | B2 | 5/2018 | Peri et al. |
| 10,074,667 | B1 | 9/2018 | Higashi et al. |
| 2009/0267128 | A1 | 10/2009 | Maejima |
| 2009/0268522 | A1 | 10/2009 | Maejima |
| 2010/0207195 | A1 | 8/2010 | Fukuzumi et al. |

(Continued)

OTHER PUBLICATIONS

M. Kodera, et al., "Nanoscale Stress Field Evaluation with Shallow Trench Isolation Structure Assessed by Cathodoluminescence Spectroscopy, Raman Spectroscopy, and Finite Element Method Analyses.", Japanese Journal of Applied Physics, vol. 47, No. 4, pp. 2506-2510, Apr. 2008.

*Primary Examiner* — Thien F Tran

(74) *Attorney, Agent, or Firm* — Oblon, McClelland, Maier & Neustadt, L.L.P.

(57) ABSTRACT

According to one embodiment, a semiconductor memory device includes: first interconnect layers; second interconnect layers; a first memory pillar extending through the first interconnect layers; a second memory pillar extending through the second interconnect layers; a first film provided above the first interconnect layers, having a planar shape corresponding to the first interconnect layers and extending in the first direction; and a second film provided above the second interconnect layers, separate from the first film in the second direction, having a planar shape corresponding to the second interconnect layers and extending in the first direction. The first and second films have a compressive stress higher than a silicon oxide film.

20 Claims, 20 Drawing Sheets

(56) References Cited

U.S. PATENT DOCUMENTS

| | | | | |
|---|---|---|---|---|
| 2011/0284946 | A1 | 11/2011 | Kiyotoshi | |
| 2012/0064682 | A1* | 3/2012 | Jang | H01L 27/11578 438/268 |
| 2015/0333083 | A1 | 11/2015 | Lai | |
| 2016/0049421 | A1 | 2/2016 | Zhang et al. | |
| 2017/0069754 | A1* | 3/2017 | Iinuma | H01L 29/7843 |
| 2017/0186766 | A1 | 6/2017 | Kitao et al. | |
| 2018/0269222 | A1* | 9/2018 | Huang | H01L 23/528 |
| 2018/0277564 | A1 | 9/2018 | Sugiura | |

* cited by examiner

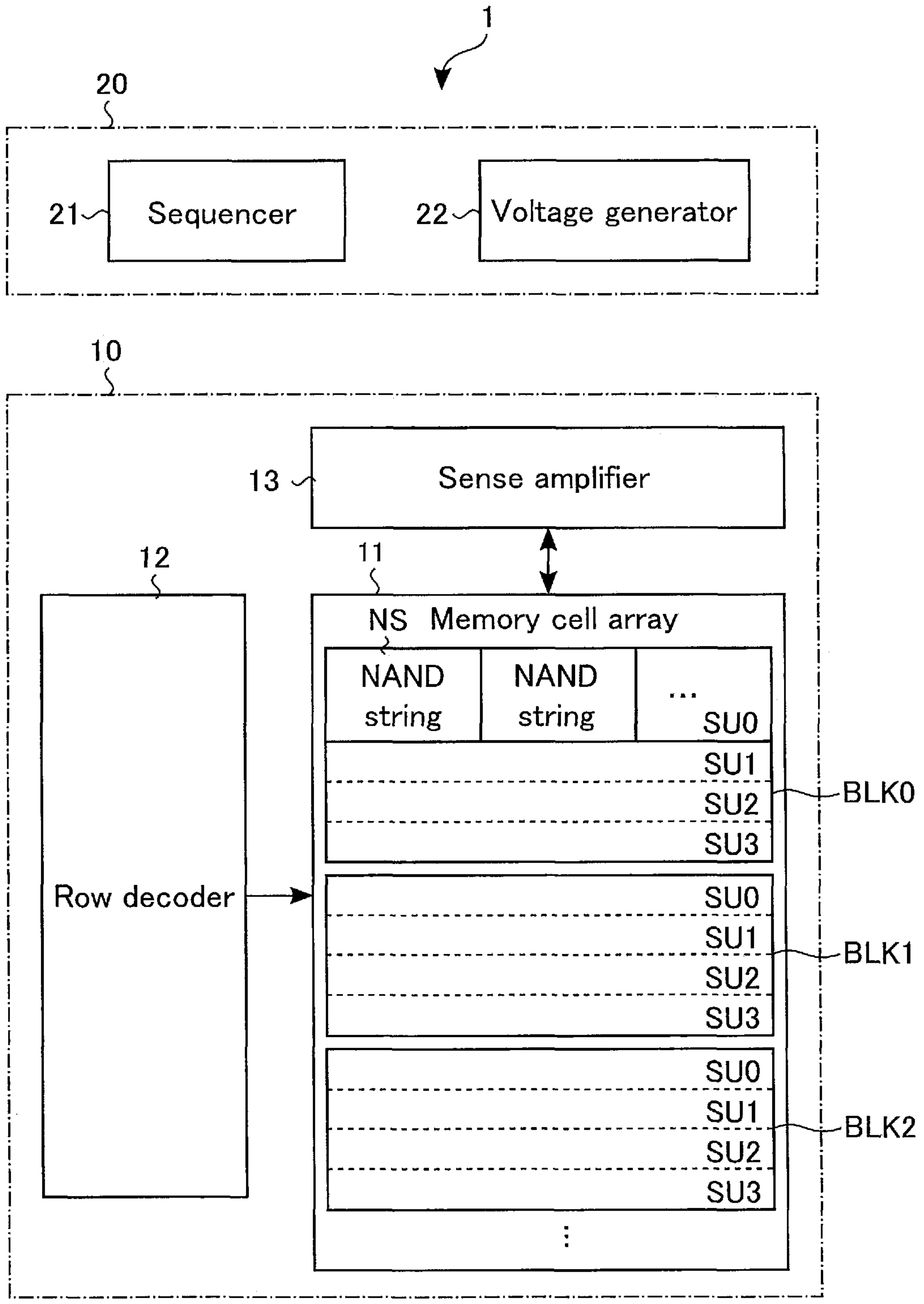
F I G. 1

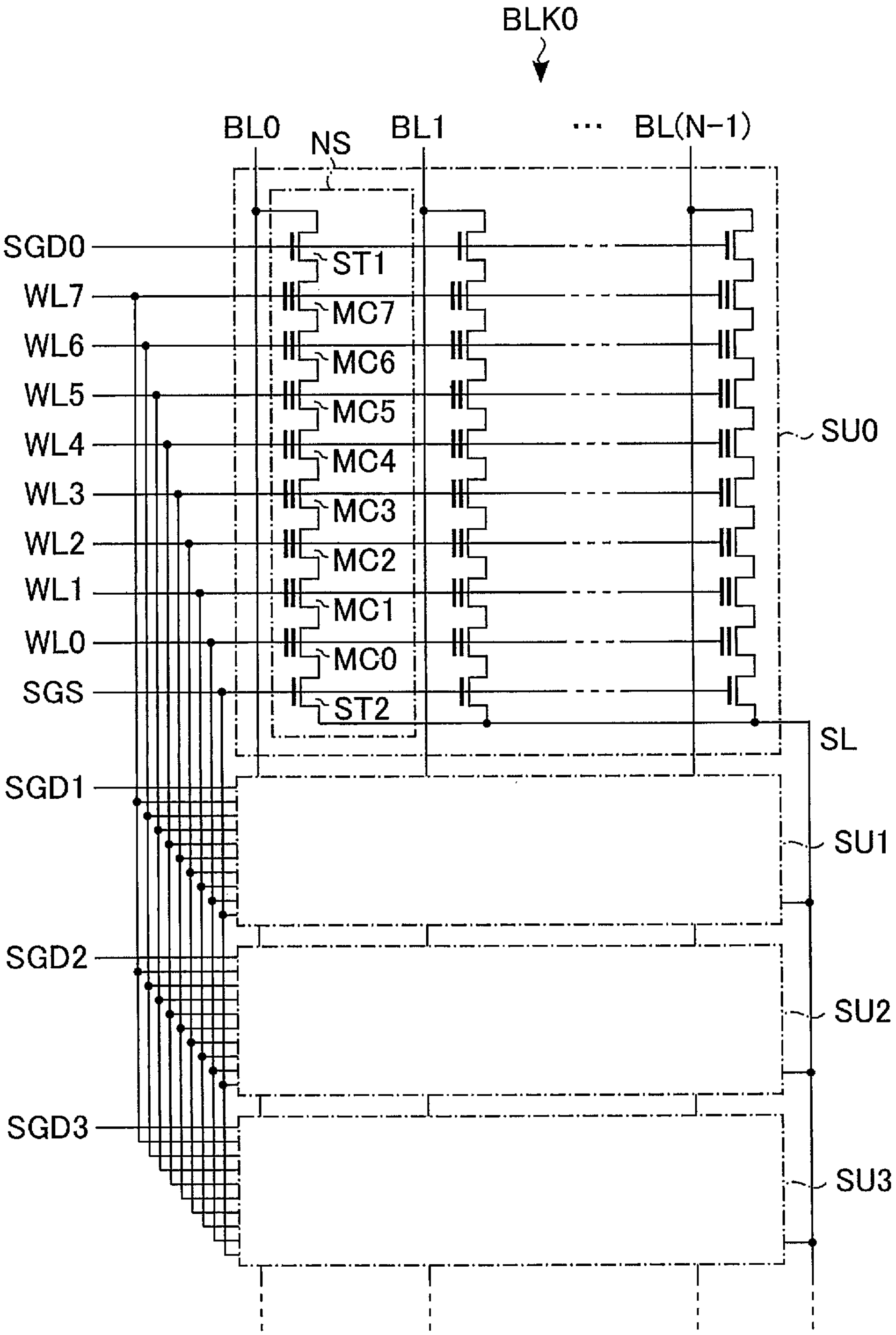
F I G. 2

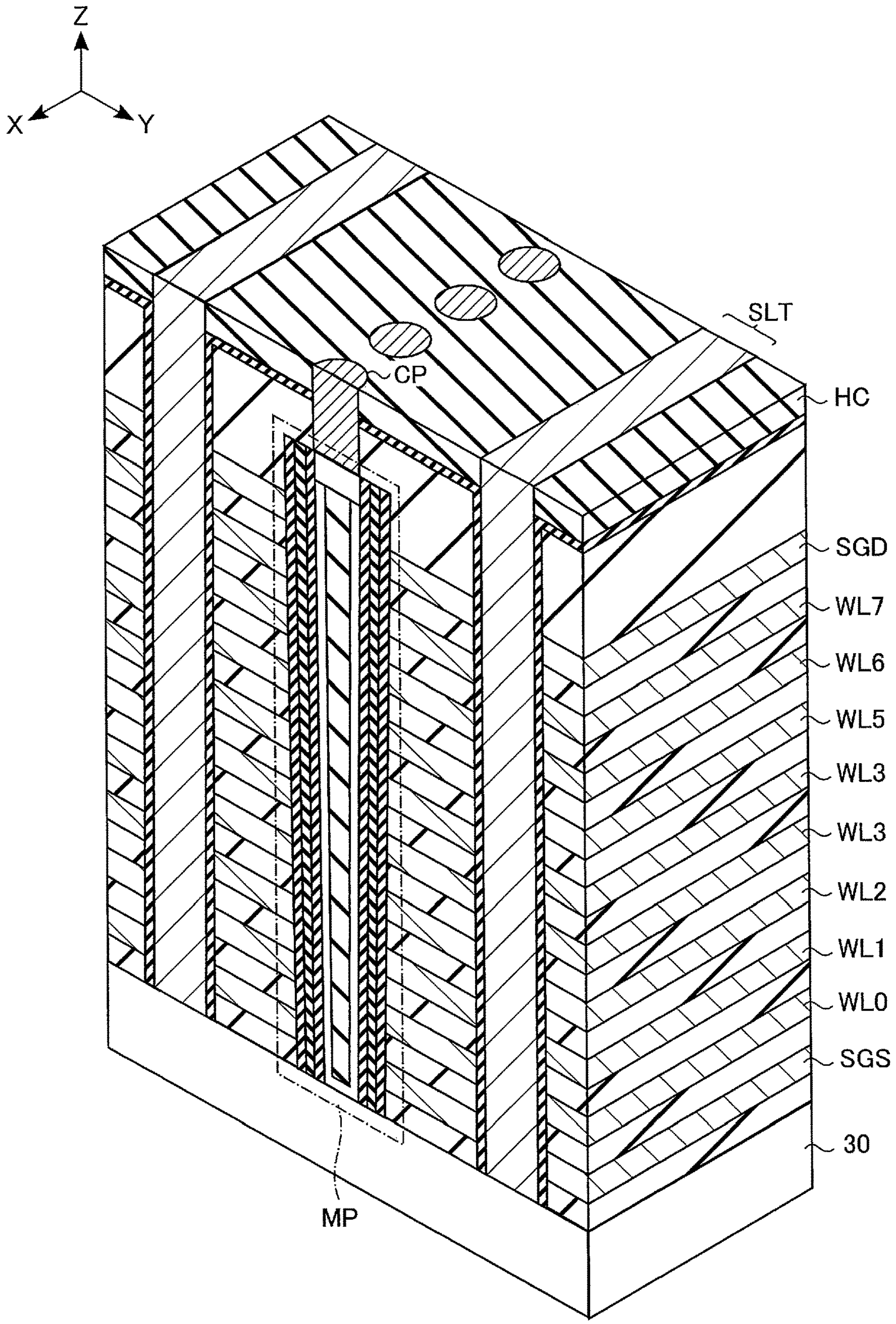
F I G. 3

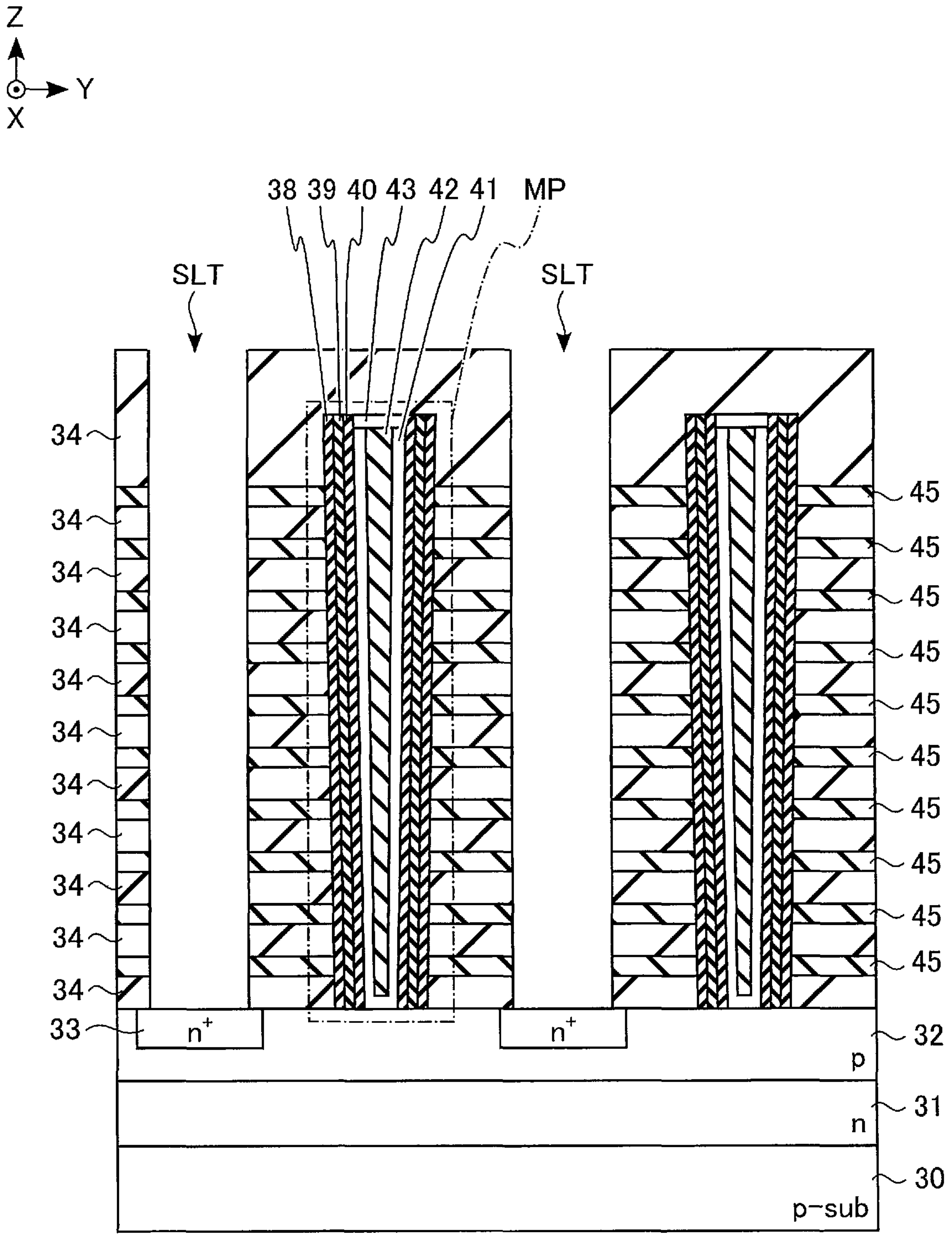
F I G. 5

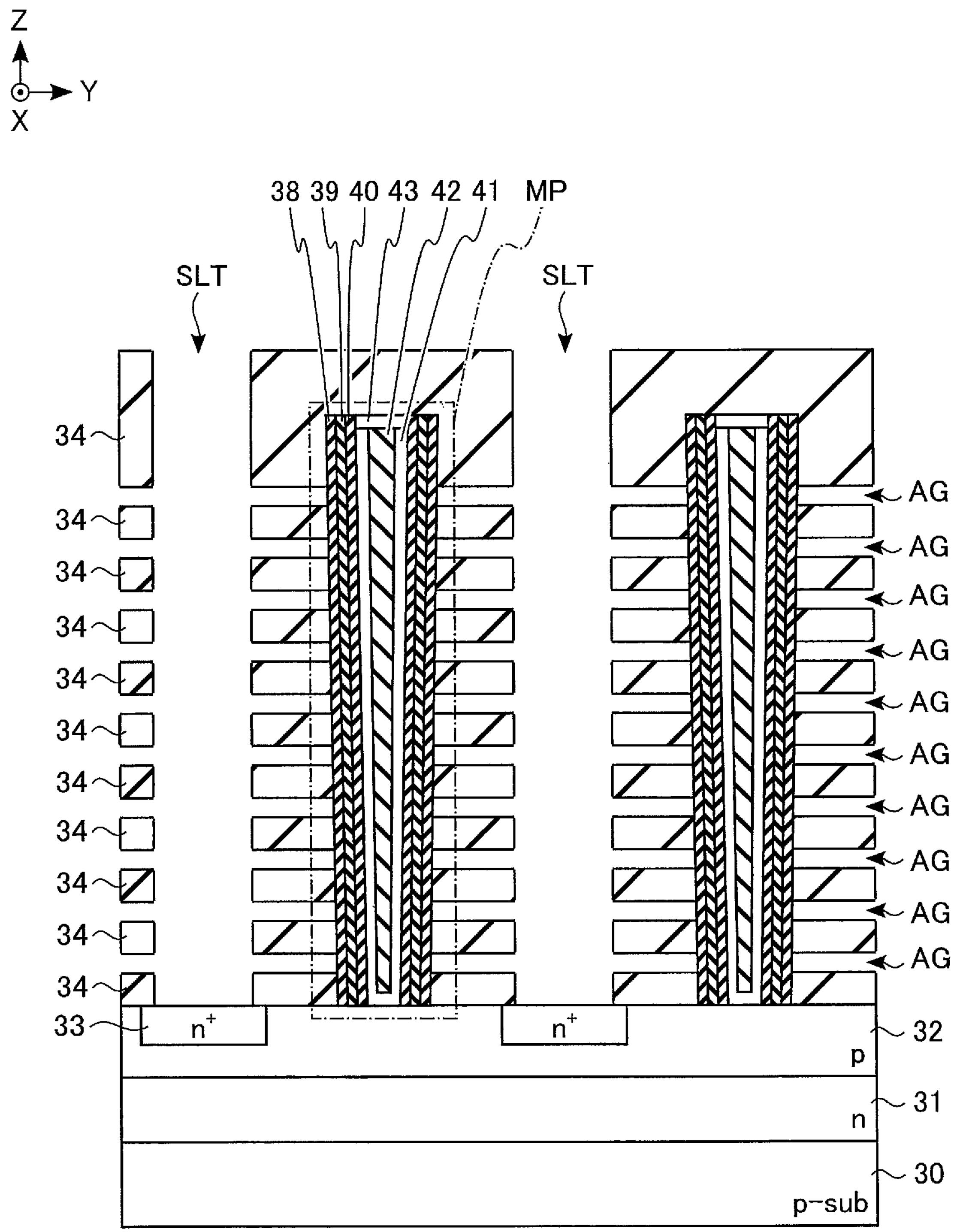
F I G. 6

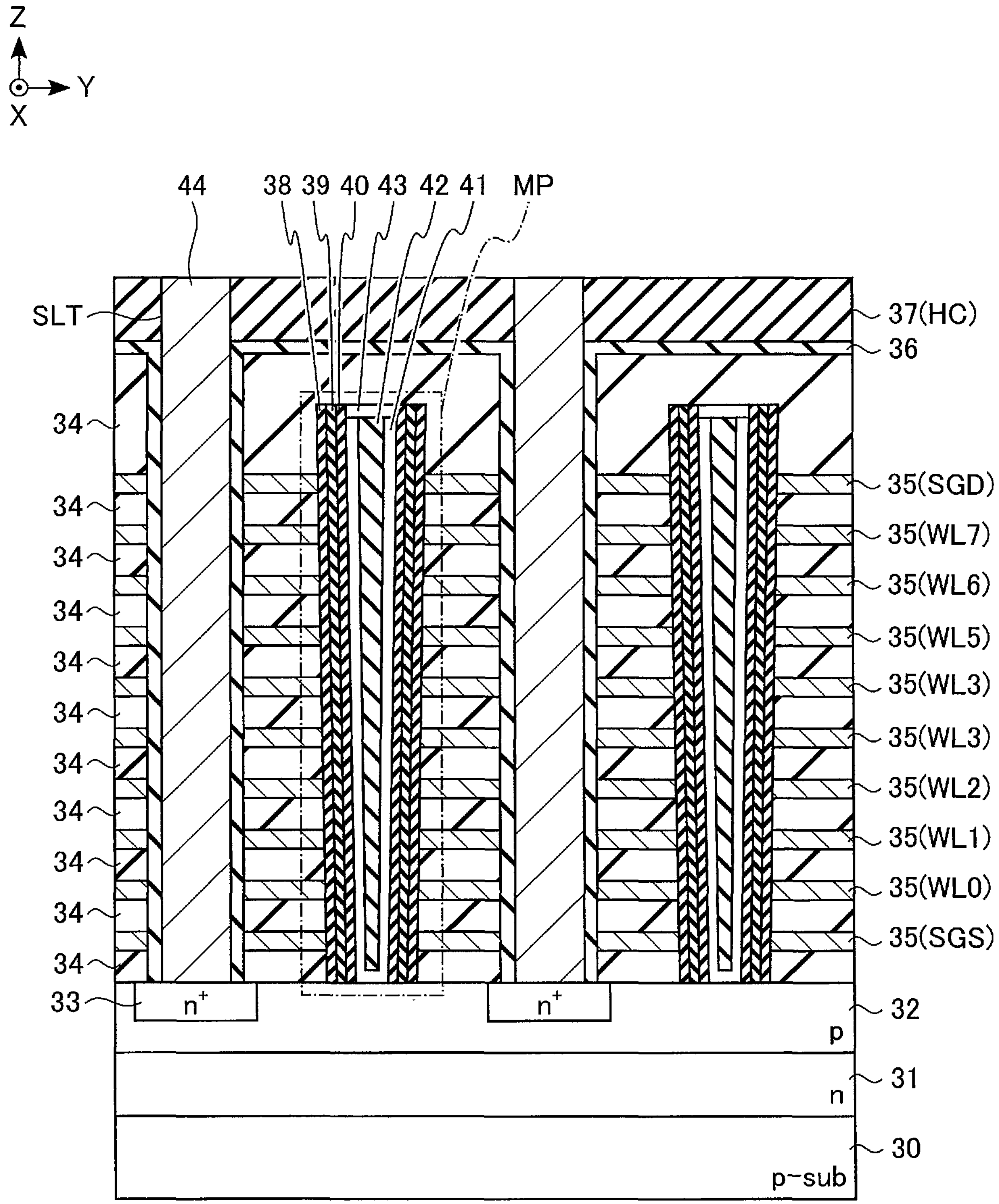
F I G. 9

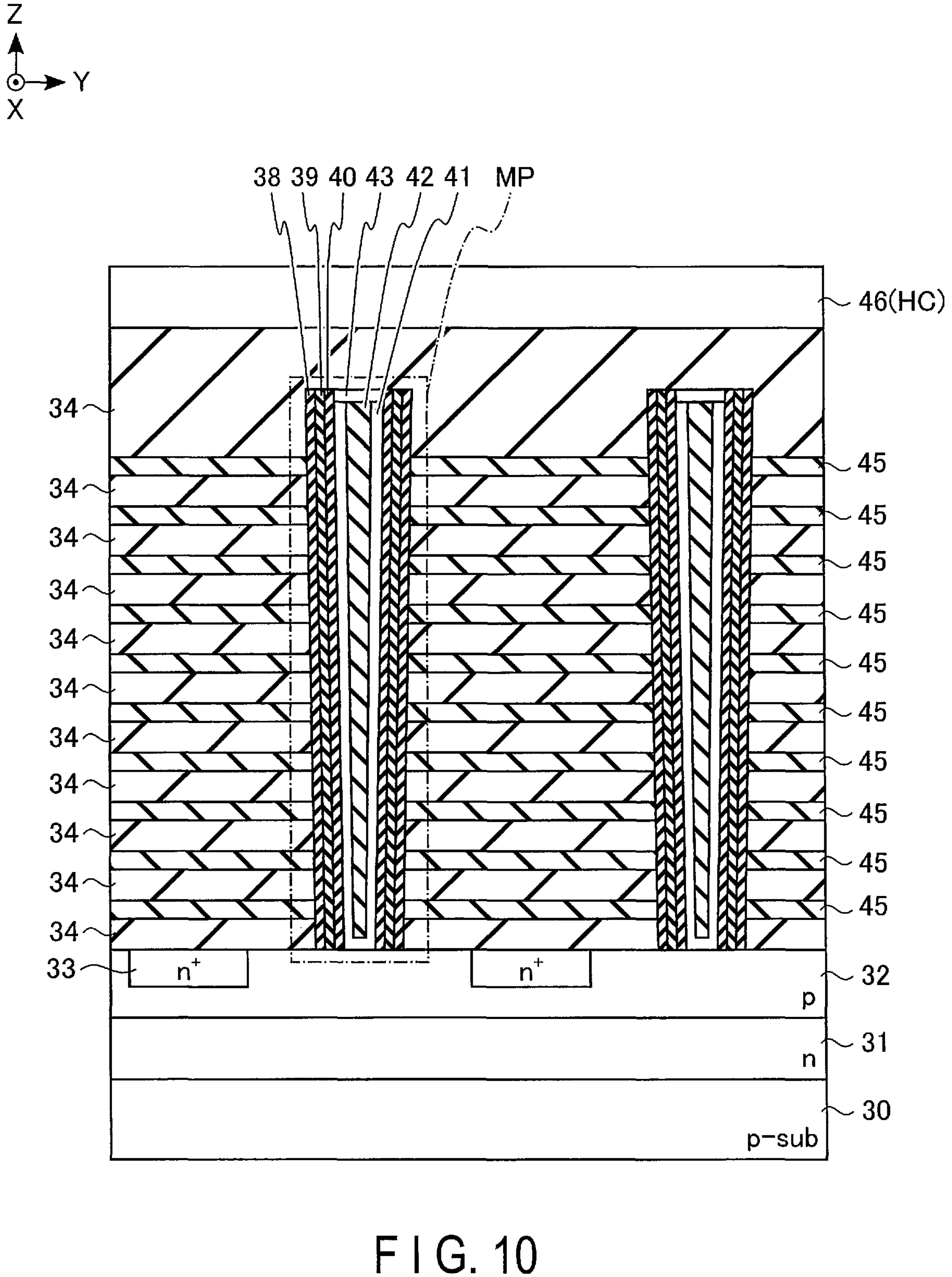
F I G. 10

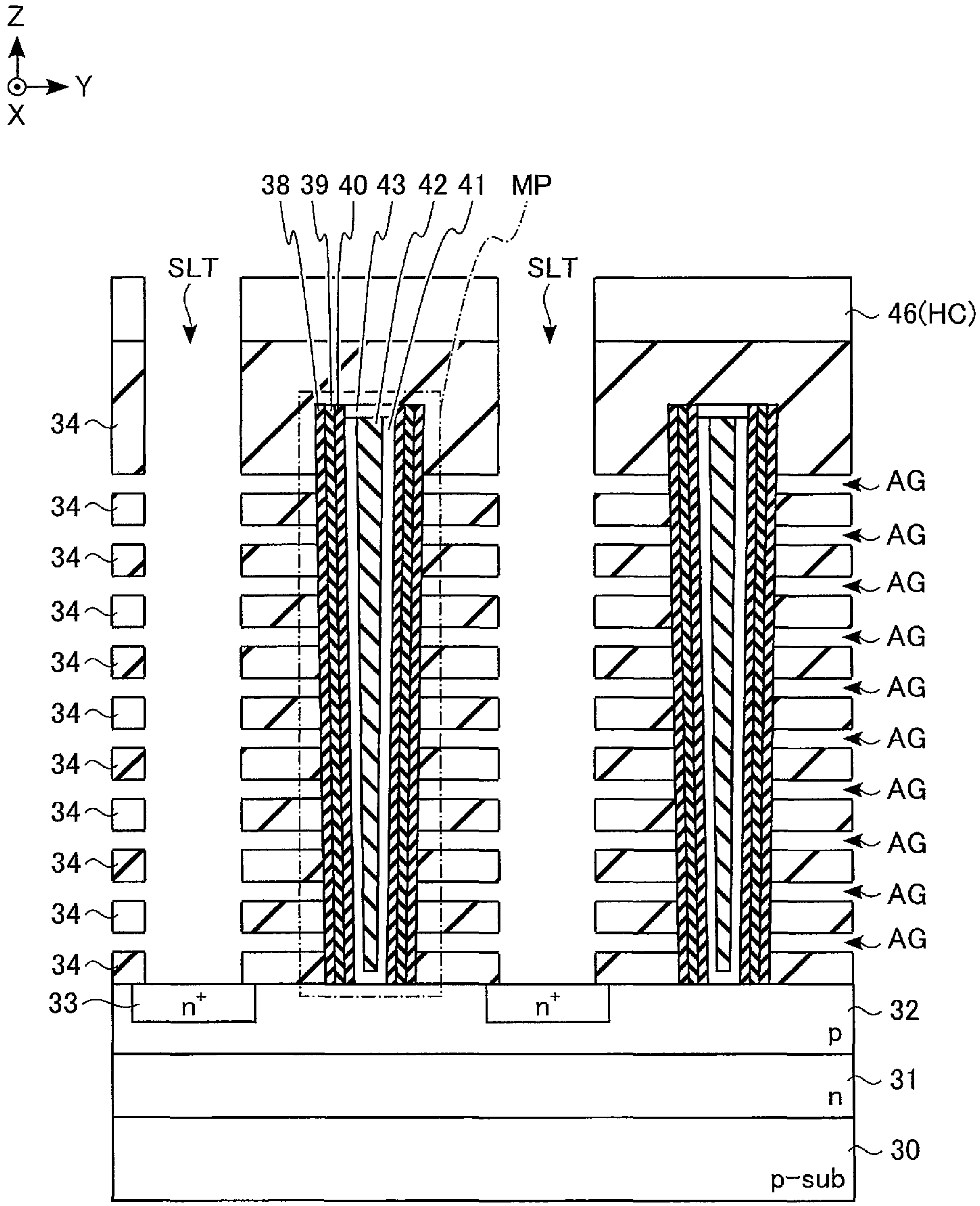
F I G. 12

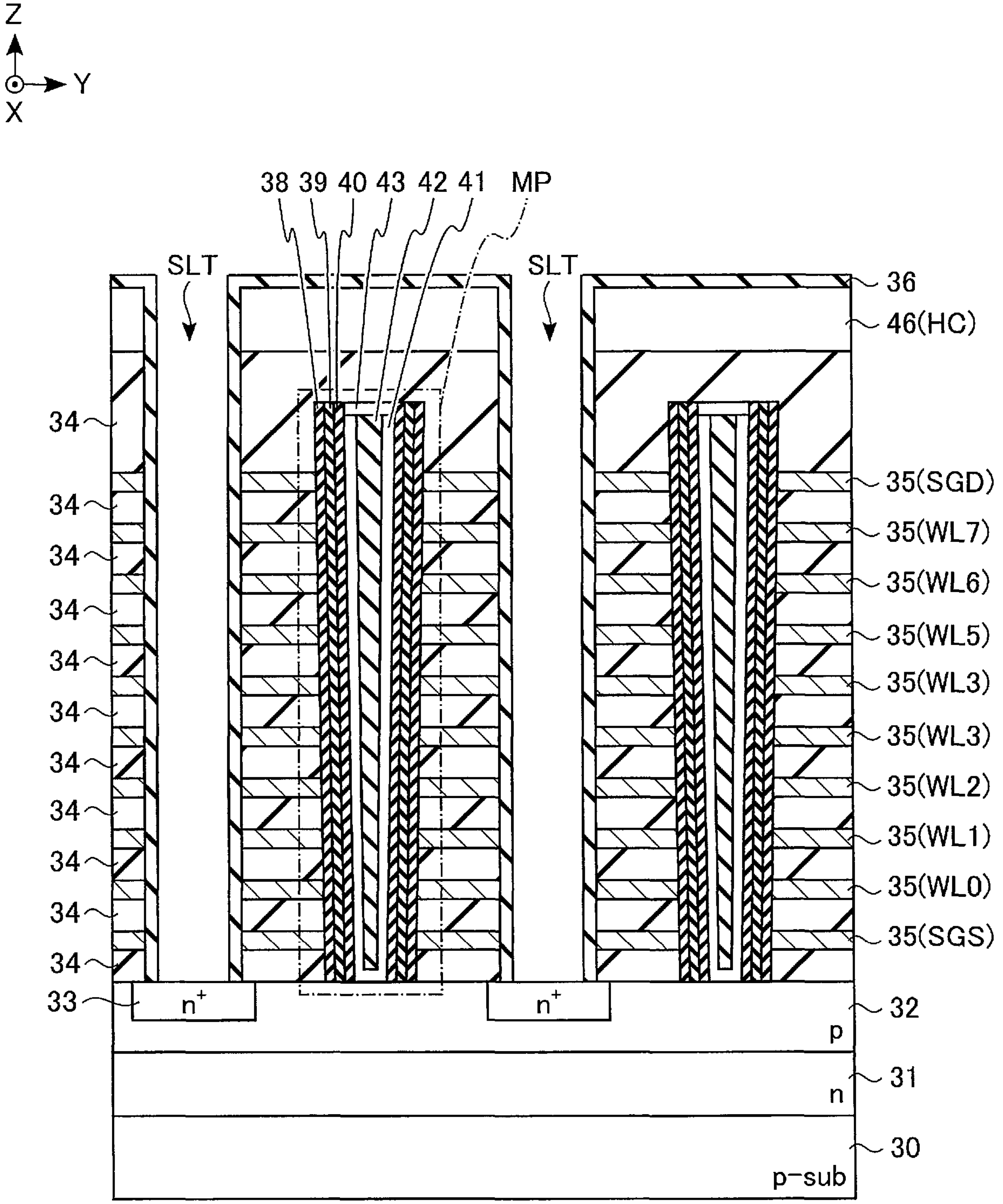
F I G. 13

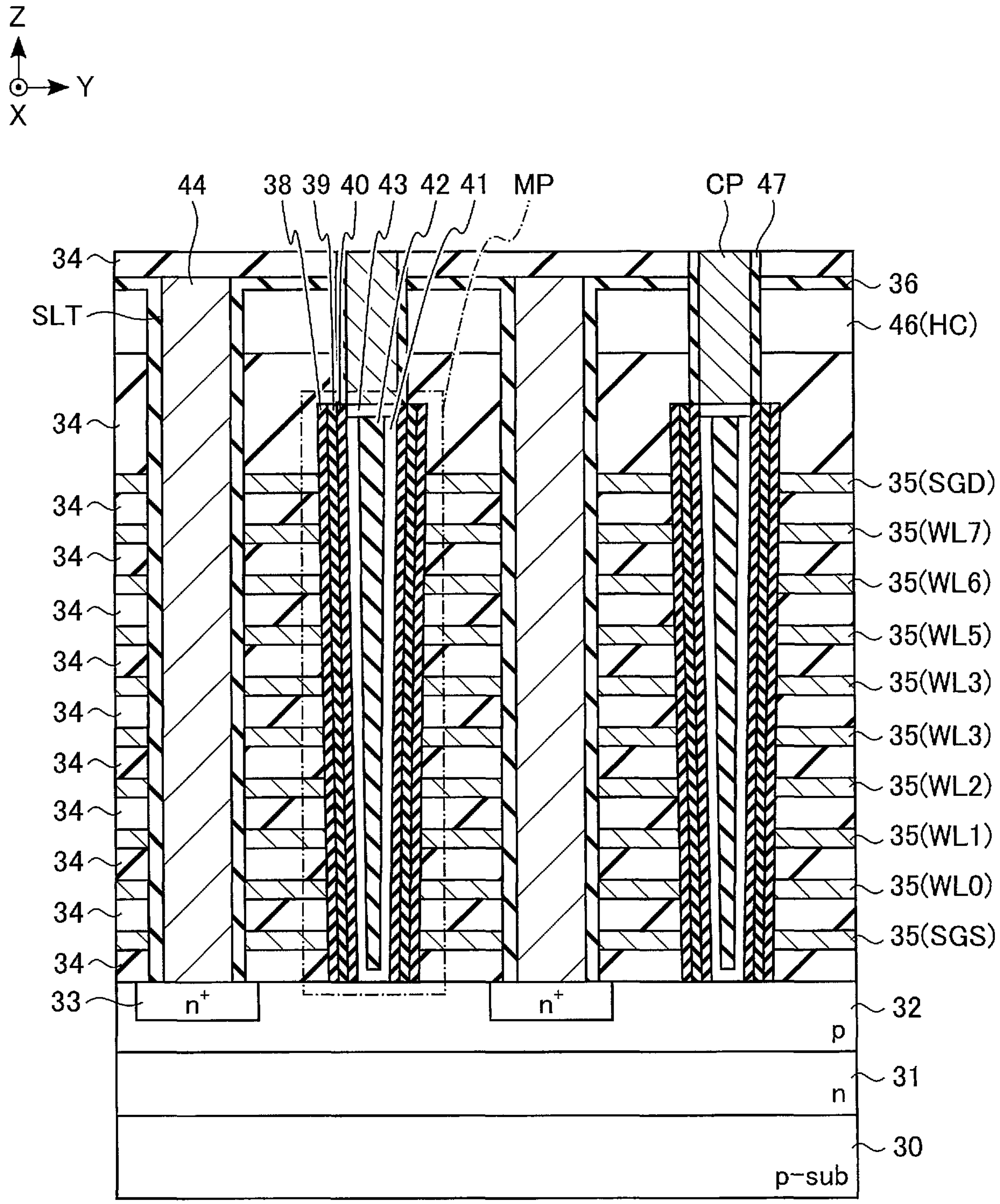
F I G. 14

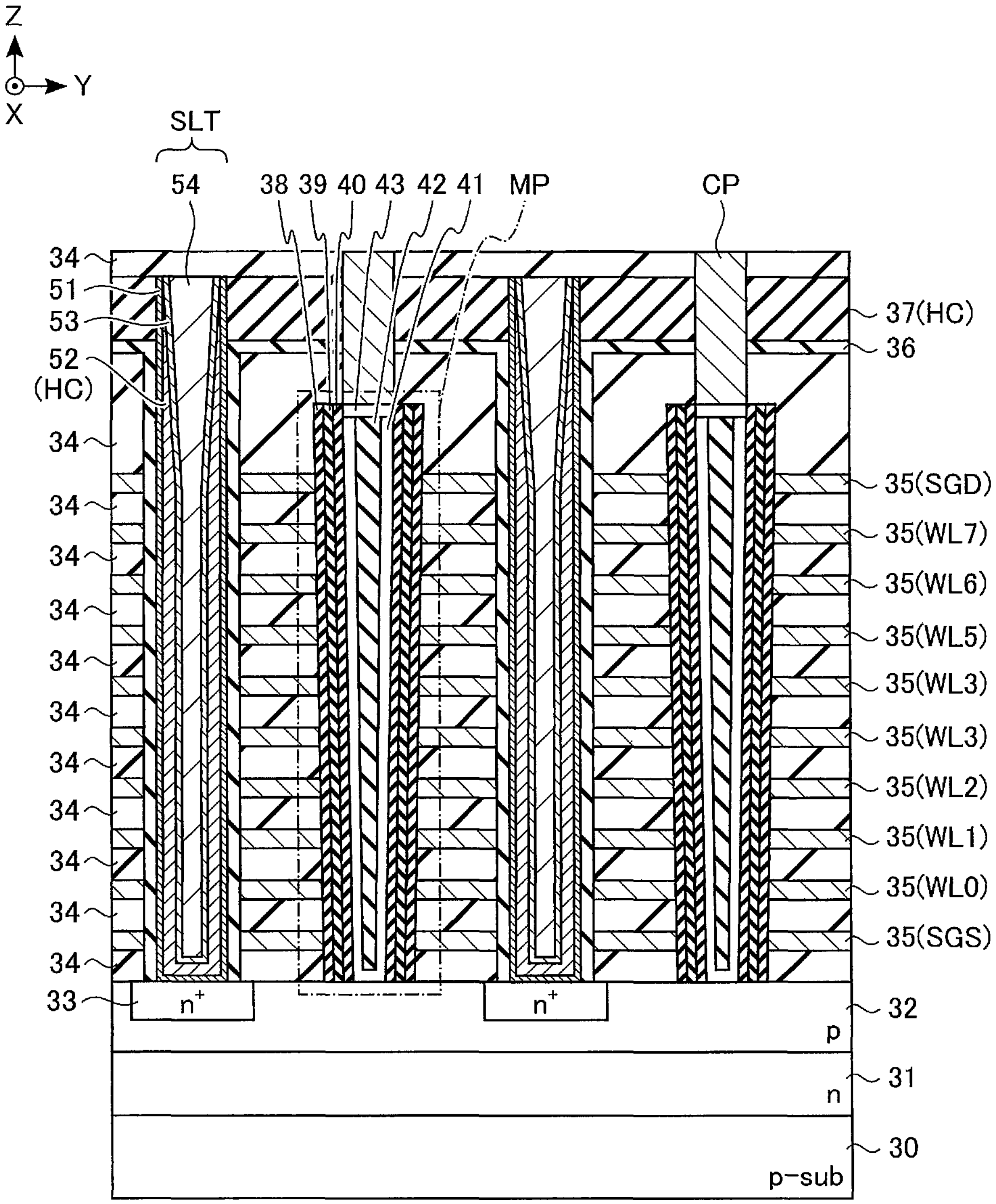
F I G. 15

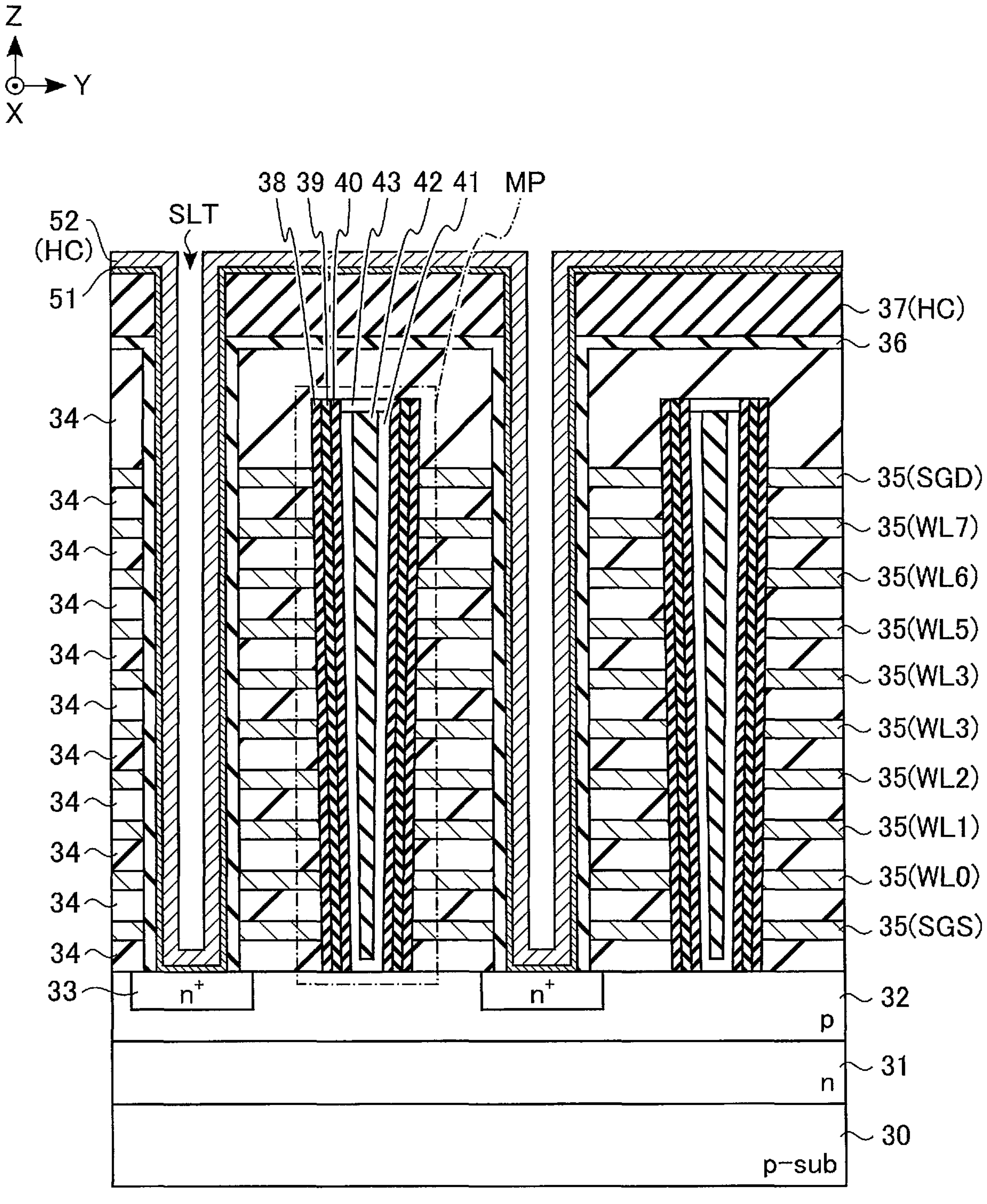
F I G. 16

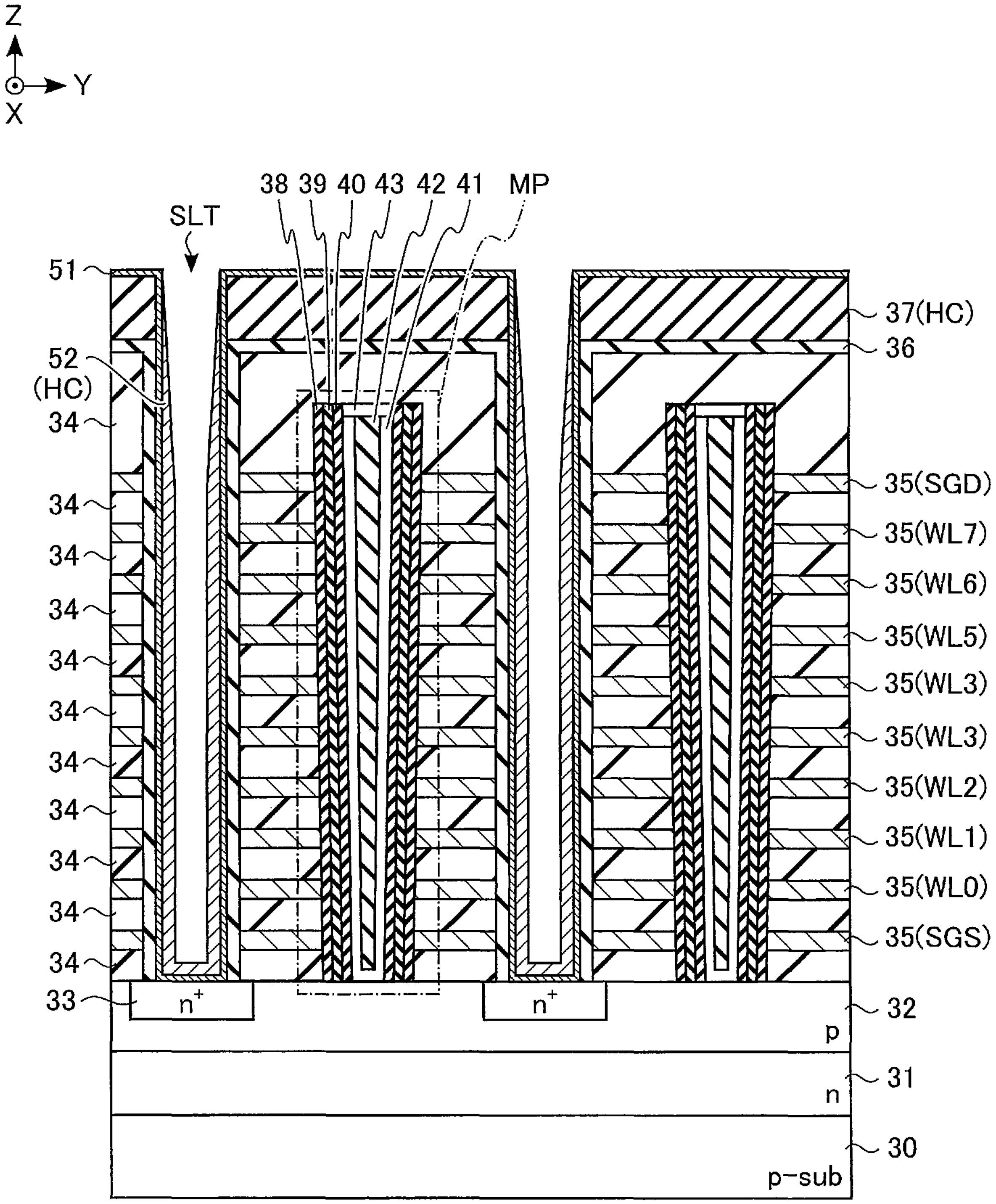
F I G. 17

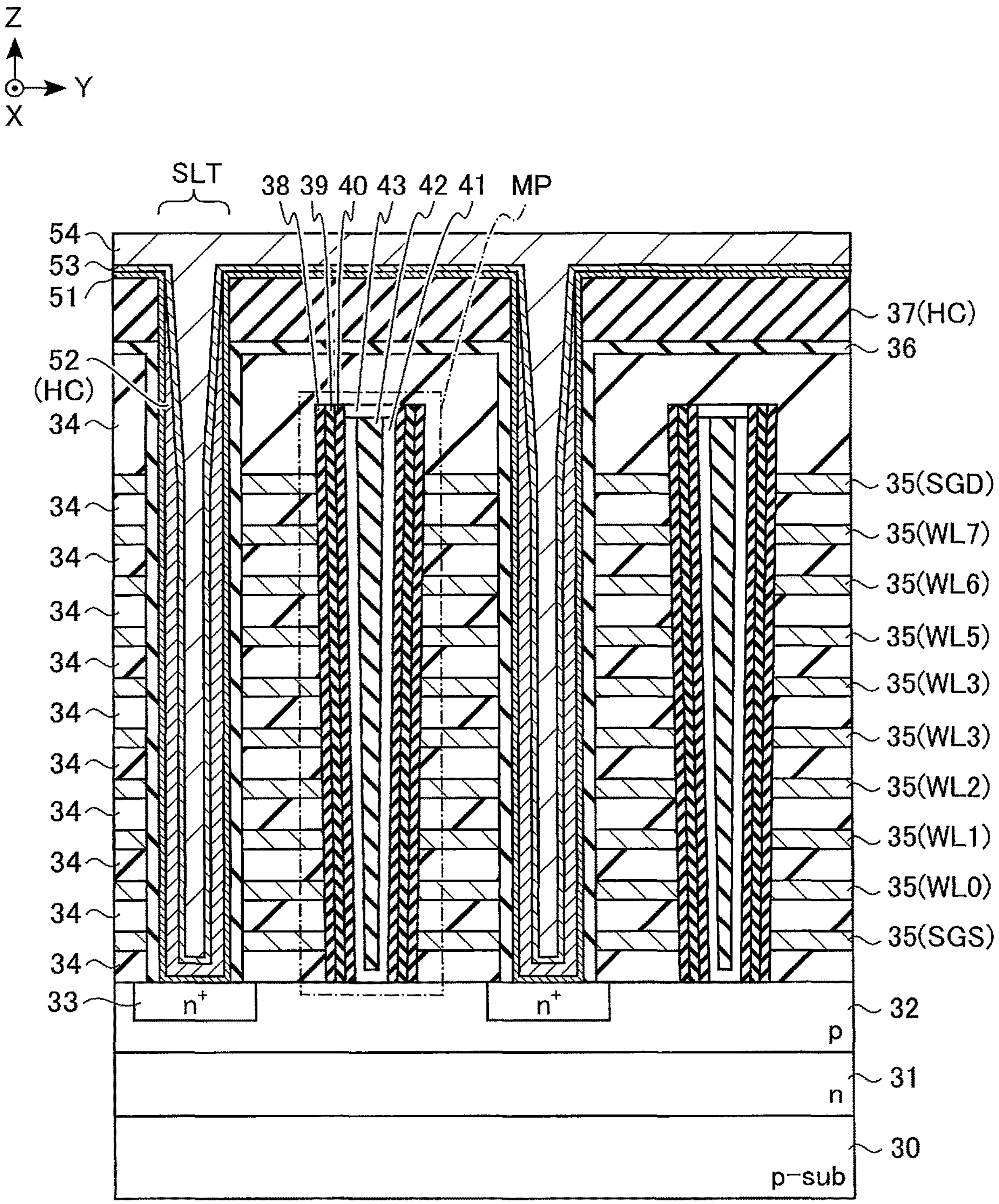
F I G. 18

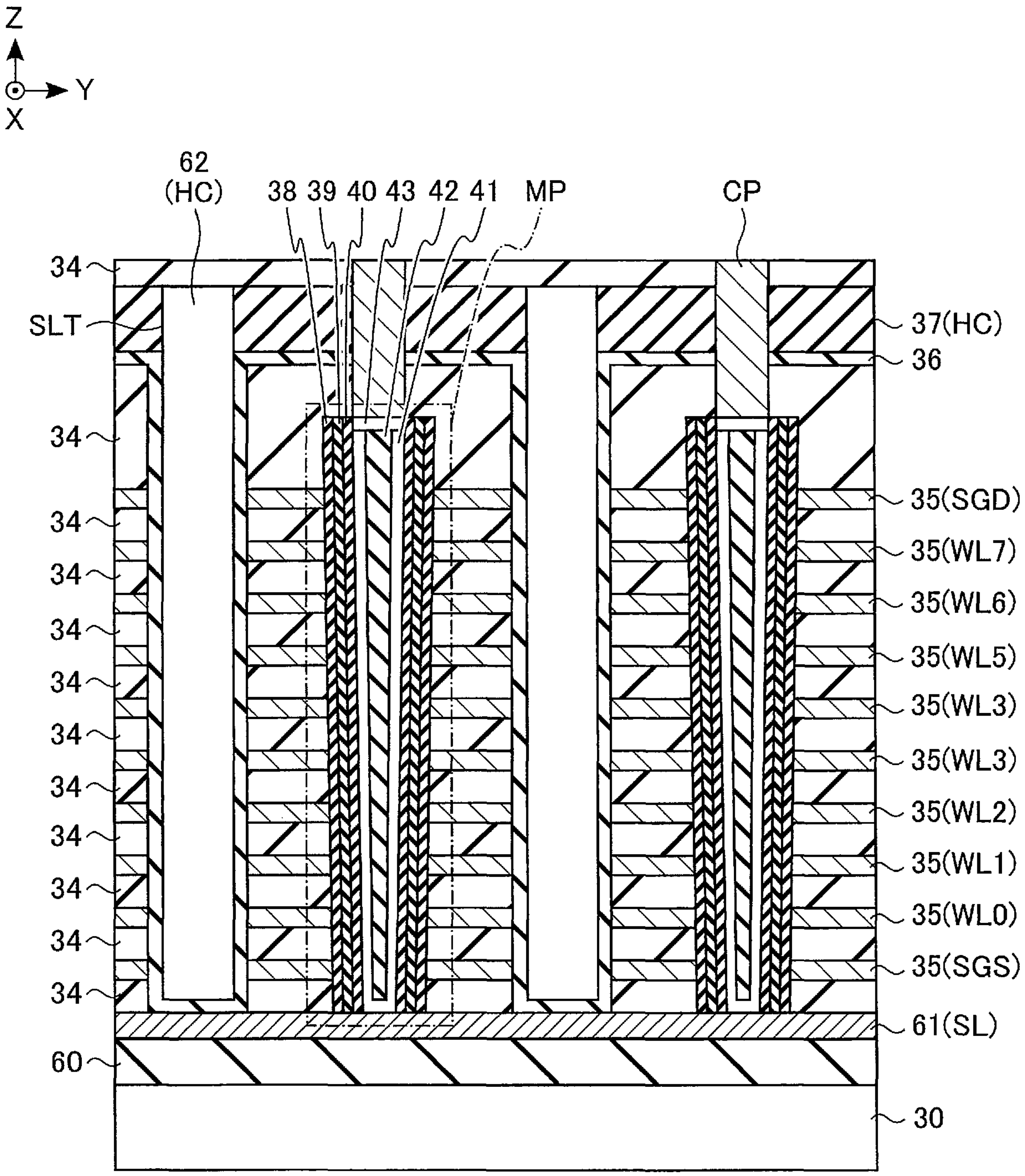
F I G. 20

SEMICONDUCTOR MEMORY DEVICE

CROSS-REFERENCE TO RELATED APPLICATIONS

This application is based upon and claims the benefit of priority from Japanese Patent Application No. 2019-048690, filed Mar. 15, 2019, the entire contents of which are incorporated herein by reference.

FIELD

Embodiments described herein relate generally to a semiconductor memory device.

BACKGROUND

A NAND flash memory has been known as a semiconductor memory device.

BRIEF DESCRIPTION OF THE DRAWINGS

FIG. 1 is a block diagram of a semiconductor memory device according to a first embodiment;

FIG. 2 is a circuit diagram of a memory cell array included in the semiconductor memory device according to the first embodiment;

FIG. 3 is a perspective view of the memory cell array included in the semiconductor memory device according to the first embodiment;

FIGS. 5 to 9 are diagrams illustrating a manufacturing process of the memory cell array included in the semiconductor memory device according to the first embodiment;

FIGS. 10 to 14 are diagrams illustrating a manufacturing process of a memory cell array included in a semiconductor memory device according to a second embodiment;

FIG. 15 is a cross sectional view of a memory cell array included in a semiconductor memory device according to a third embodiment;

FIGS. 16 to 19 are diagrams illustrating a manufacturing process of the memory cell array included in the semiconductor memory device according to the third embodiment; and FIG. 20 is a cross sectional view of a memory cell array included in a semiconductor memory device according to a fourth embodiment.

DETAILED DESCRIPTION

Figure 4:
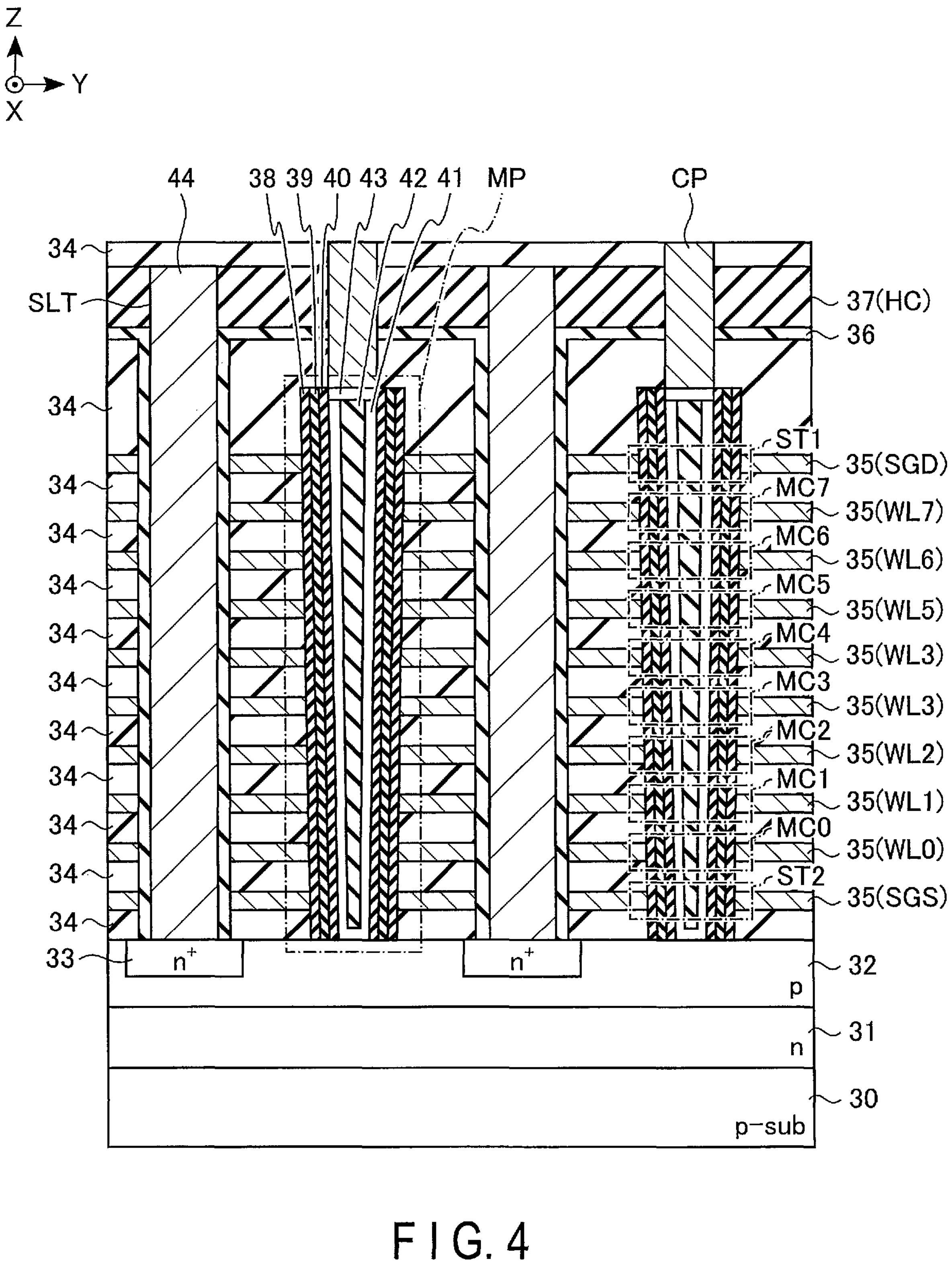
FIG. 4 is a cross sectional view of the memory cell array included in the semiconductor memory device according to the first embodiment.

In general, according to one embodiment, a semiconductor memory device includes: a plurality of first interconnect layers; a plurality of second interconnect layers; a first memory pillar; a second memory pillar; a first film; and a second film. The first interconnect layers extend in a first direction that is second interconnect layers extend in the first direction, and is separate from and adjacent to the first interconnect layers in a second direction that is substantially parallel to the semiconductor substrate and orthogonal to the first direction. The first memory pillar extends through the first interconnect layers in a third direction that is substantially vertical to the semiconductor substrate. The second memory pillar extends through the second interconnect layers in the third direction. The first film is provided above the first interconnect layers, has a planar shape corresponding to the first interconnect layers and extends in the first direction. The second film is provided above the second interconnect layers, is separate from the first film in the second direction, has a planar shape corresponding to the second interconnect layers and extends in the first direction. The first and second films have a compressive stress higher than a silicon oxide film.

1. First Embodiment

A semiconductor memory device according to the first embodiment is explained. In the following description, a three-dimensionally layered NAND flash memory in which memory cell transistors are three-dimensionally stacked on a semiconductor substrate is discussed as an exemplary semiconductor memory device.

1.1 Structure

1.1.1 Overall Structure of Semiconductor Memory Device

The overall structure of a semiconductor memory device is explained with reference to FIG. 1. In FIG. 1, an exemplary block diagram of a basic overall structure of a semiconductor memory device is presented.

A semiconductor memory device 1 includes a memory core region 10 and a peripheral circuitry region 20, as illustrated in FIG. 1.

The memory core region 10 includes a memory cell array 11, a row decoder 12, and a sense amplifier 13.

The memory cell array 11 includes a plurality of blocks BLK (BLK0, BLK1, BLK2, . . . ). Each block BLK includes a plurality of string units SU (four string units in the present embodiment, SU0 to SU3) each of which is a set of NAND strings NS each having memory cell transistors coupled in series. The memory cell array 11 may contain any number of blocks BLK, and a block BLK may contain any number of string units SU.

The row decoder 12 decodes a row address received from an external controller (not shown). The row decoder 12 selects a row of the memory cell array 11 based on the decoding result. Specifically, the row decoder 12 applies voltages to various interconnects for selection of a row.

When reading data, the sense amplifier 13 senses the data read from one of the blocks BLK. When writing data, the sense amplifier 13 applies to the memory cell array 11 voltages corresponding to the write data.

The peripheral circuitry region 20 includes a sequencer 21 and a voltage generator 22.

The sequencer 21 controls the entire operation of the semiconductor memory device 1. Specifically, the sequencer 21 controls the voltage generator 22, row decoder 12, and sense amplifier 13 during the write operation, read operation, and erase operation.

The voltage generator 22 generates voltages to be used for the write operation, read operation, and erase operation, and supplies the voltages to the row decoder 12 and sense amplifier 13.

1.1.2 Structure of Memory Cell Array

Next, the structure of the memory cell array 11 is explained with reference to FIG. 2. The example of FIG. 2 shows block BLK0, but other blocks BLK have the same structure.

As illustrated in FIG. 2, block BLK0 may contain four string units SU0 to SU3. Each of the string units SU contains a plurality of NAND strings NS. Each of the NAND strings NS may contain eight memory cell transistors MC (MC0 to MC7) and select transistors ST1 and ST2. A memory cell transistor MC includes a control gate and a charge storage layer so as to store data in a non-volatile manner. A memory cell transistor that is not limited to any of the memory cell transistors MC0 to MC7 will be simply referred to as a memory cell transistor MC.

The charge storage layer of the memory cell transistor MC may be of a MONOS type, which includes an insulation film, or may be of an FG type, which includes a conductive layer. In the present embodiment, a MONOS type will be discussed as an example. The number of memory cell transistors MC is not limited to 8, and 16, 32, 64, 96, or 128 memory cell transistors may be included. These numbers are not limitations. In the example of FIG. 2, one select transistor ST1 and one select transistor ST2 are included in one NAND string NS. A NAND string NS may include one or more select transistors ST1 and one or more select transistors ST2.

In the NAND string NS, the current paths of the select transistor ST2, memory cell transistors MC0 to MC7, and select transistor ST1 are coupled in series in this order. The drain of the select transistor ST1 is coupled to a corresponding bit line BL. The source of the select transistor ST2 is coupled to a source line SL.

The control gates of the memory cell transistors MC0 to MC7 in different NAND strings NS of the same block BLK are coupled commonly to corresponding word lines WL0 to WL7. For example, the control gates of the multiple memory cell transistors MC0 in a block BLK are coupled commonly to the word line WL0.

The gates of the select transistors ST1 in the different NAND strings NS of the same string unit SU are coupled commonly to a select gate line SGD. Specifically, the gates of the select transistors ST1 in the string unit SU0 are coupled to a select gate line SGD0. The gates of the select transistors ST1 (not shown) in the string unit SU1 are coupled to a select gate line SGD1. The gates of the select transistors ST1 (not shown) in the string unit SU2 are coupled to a select gate line SGD2. The gates of the select transistors ST1 (not shown) in the string unit SU3 are coupled to a select gate line SGD3. A select gate line that is not limited to any of the select gate lines SGD0 to SGD3 will be referred to as a select gate line SGD.

The gates of the select transistors ST2 in the same block BLK are coupled commonly to a select gate line SGS. Alternatively, the gates of the select transistors ST2 in the string units SU0 to SU3 may be coupled to different select gate lines SGS for different string units SU.

The drains of the select transistors ST1 in a string unit SU are coupled to different bit lines BL (BL0 to BL(N−1), where N is a natural number larger than or equal to 2). Therefore, the NAND strings NS in a string unit SU are coupled to different bit lines BL. A bit line BL commonly couples NAND strings NS respectively included in the string units SU0 to SU3 of each block BLK.

The sources of the select transistors ST2 in different blocks BLK are coupled commonly to the source line SL.

That is, a string unit SU is a set of NAND strings NS that are coupled to different bit lines BL and commonly to the same select gate line SGD. A block BLK is a set of string units SU that share word lines WL. A memory cell array 11 is a set of blocks BLK that share bit lines BL.

The memory cell array 11 may have a structure other than the above. The structure of a memory cell array 11 is described, for example, in U.S. patent application Ser. No. 12/407,403 filed on Mar. 19, 2009, entitled "Three Dimensional Stacked Nonvolatile Semiconductor Memory". It is also described in U.S. patent application Ser. No. 12/406,524 filed on Mar. 18, 2009, entitled "Three Dimensional Stacked Nonvolatile Semiconductor Memory"; U.S. patent application Ser. No. 12/679,991 filed on Mar. 25, 2010, entitled "Non-Volatile Semiconductor Storage Device and Method of Manufacturing the Same"; and U.S. patent application Ser. No. 12/532,030 filed on Mar. 23, 2009, entitled "Semiconductor Memory and Method for Manufacturing Same". The entire contents of these applications are incorporated herein by reference.

1.1.3 Structure of Memory Cell Array

Next, the structure of a memory cell array 11 is explained with reference to FIGS. 3 and 4. FIG. 3 is a perspective view of the memory cell array 11. FIG. 4 is a cross sectional view of the memory cell array 11.

As illustrated in FIG. 3, a select gate line SGS, word lines WL0 to WL7, and a select gate line SGD are stacked above a semiconductor substrate 30 in the Z direction in a manner as to extend in the X direction that is substantially parallel to the semiconductor substrate 30, the Z direction is substantially vertical to the semiconductor substrate 30 and substantially orthogonal to the X direction. The word lines WL and the select gate lines SGS and SGD are separated in the Y direction by slits SLT that extend in the X direction, resulting in individual blocks BLK in the blocks BLK, where the Y direction is substantially parallel to the semiconductor substrate 30 and substantially orthogonal to the X direction and Z direction. The select gate line SGD is further separated in the Y direction, resulting individual string units SU, by a shallow slit (not shown) that extends in the X direction between two adjacent slits SLT. When viewed from the Z direction, the word lines WL and select gate lines SGS and SGD may be rectangular, with their sides longer in the X direction and shorter in the Y direction. For the present embodiment, a structure in which a source line contact is formed in slits SLT is explained. The source line contact couples the semiconductor substrate 30 to the source line SL (not shown) provided above the memory pillar MP.

For interconnect layers that function as word lines WL and select gate lines SGS and SGD, a semiconductor material such as n-type semiconductor or p-type semiconductor, or a metallic material such as tungsten (W), may be adopted. The tungsten formed by chemical vapor deposition (CVD) has a tensile stress. As a result, when the word lines WL and select gate lines SGS and SGD are, for example, rectangular with their sides longer in the X direction and shorter in the Y direction, the semiconductor substrate 30 tends to be warped considerably in the X direction under the influence of the word lines WL and select gate lines SGS and SGD.

According to the present embodiment, in order to reduce the warpage of the semiconductor substrate in the X direction due to the tensile stress of the word lines WL and select gate lines SGS and SGD, a high compressive stress film HC is provided above the select gate line SGD. This high compressive stress film HC can have a compressive stress in a direction opposite to the tensile stress of the word lines WL and selection gate lines SOS and SGD. In a similar manner to the word lines WL and select gate lines SGS and SGD, the high compressive stress film HC extends in the X direction and is separated in the Y direction by the slits SLT. That is, the high compressive stress film HC is rectangular with its sides longer in the X direction and shorter in the Y direction when viewed from the Z direction, having a planar shape that corresponds to the shapes of the word lines WL and select gate line SGS. The high compressive stress film HC have a compressive stress higher than the silicon oxide film ($SiO_2$). For example, $SiO_2$ deposited by parallel plate plasma CVD produces a compressive stress of approximately −100 to −200 MPa (the sign "-" representing a compressive stress). It is therefore preferable that the high compressive stress film HC be configured to have a high compressive stress of −300 MPa or greater (having an absolute value of 300 MPa or greater). In the present embodiment, a structure that includes a silicon nitride film (SiN) formed by physical vapor deposition (PVD) such as sputtering, as the high compressive stress film HC is explained. The PVD-SiN produces a compressive stress of −1 GPa or greater. Unlike CVD-SiN, a PVD-SiN film contains very little hydrogen (H). PVD-SiN and CVD-SiN are therefore distinguishable from each other by analysis of secondary ion mass spectrometry (SIMS) or the like.

A high compressive stress film HC may be formed by adding impurities such as carbon (C) or boron (B) to the CVD-SiN, in place of PVD-SiN. An insulation film other than SiN may be adopted. Furthermore, the high compressive stress film HC is not limited to an insulation film. For example, the high compressive stress film HC may be formed of a semiconductor material or a metallic material. The high compressive stress film HC may be formed of amorphous silicon, polysilicon, or tungsten (W) to which nitrogen (N) or the like is added.

A plurality of memory pillars MP are arranged along the X direction between two adjacent slits SLT in the Y direction in a manner to extend in the Z direction and penetrate through the word lines WL and select gate lines SGS and SGD. One memory pillar MP corresponds to one NAND string NS. A memory pillar MP will be discussed later in detail. The memory pillars MP between two slits SLT may be arranged in any manner. For example, four memory pillars MP may be arranged in a staggered manner in the X direction.

A contact plug CP is arranged on a memory pillar MP to penetrate through the high compressive stress film HC. The contact plug CP couples the memory pillar MP to a bit line BL (not shown) provided above the high compressive stress film HC.

The cross-sectional structure of the memory cell array 11 is explained next.

As illustrated in FIG. 4, an n-type well 31 is provided in the surface region of a semiconductor substrate (p-type semiconductor substrate) 30. A p-type well 32 is provided in the surface region of the n-type well 31. Furthermore, an n+-type diffusion layer 33 is provided in part of the surface region of the p-type well 32. On the p-type well 32, eleven insulating layers 34, and ten interconnect layers 35 that serve as a select gate line SGS, word lines WL0 to WL7, and a select gate line SGD, are alternately stacked. The insulating layers 34 and interconnect layers 35 extend in the X direction. For the insulating layers 34, SiO2 may be adopted. A structure that includes, a layered structure of titanium nitride (TiN) and tungsten (W) is adopted for interconnect layers 35 is explained hereinbelow. TiN functions, for example, as a barrier layer that prevents W from reacting with Si or SiO2, or an adhesive layer that enhances the adhesion of W during the CVD formation of W.

An insulating layer 36 is formed so as to cover the top and side surfaces of the layered structure including the eleven insulating layers 34 and ten interconnect layers 35. SiO2 may be used for the insulating layer 36.

An insulating layer 37 is formed on the insulating layer 36 to extend in the X direction. This insulating layer 37 functions as a high compressive stress film HC, for which PVD-SiN may be adopted. Conductive layers 44, which will be discussed later, are formed on the sides of the layered structure, with the insulating layer 36 interposed therebetween. An insulating layer 34 is formed on the insulating layer 37 and conductive layer 44.

A memory pillar MP is formed to penetrate through the ten interconnect layers 35, with its bottom surface reaching the p-type well 32. The memory pillar MP includes a block insulation film 38, a charge storage layer 39, a tunnel insulation film 40, a semiconductor layer 41, a core layer 42, and a cap layer 43.

Specifically, a hole for a memory pillar MP is formed to penetrate through the ten interconnect layers 35 such that its bottom reaches the p-type well 32. A block insulation film 38, charge storage layer 39, and tunnel insulation film 40 are stacked in this order on the side surface of the hole. A semiconductor layer 41 is formed in a manner that its side surface is in contact with the tunnel insulation film 40 and its bottom surface is in contact with the p-type well 32. The semiconductor layer 41 provides a region in which a channel for the memory cell transistors MC and select transistors ST1 and ST2 can be formed. The semiconductor layer 41 therefore functions as a signal line that couples the current paths of the select transistor ST2, memory cell transistors MC0 to MC7, and select transistor ST1. A core layer 42 is provided inside the semiconductor layer 41. A cap layer 43 is formed on the semiconductor layer 41 and core layer 42, with its side surface in contact with the tunnel insulation film 40.

For the block insulation film 38, tunnel insulation film 40, and core layer 42, SiO2 may be adopted. For the charge storage layer 39, SiN may be adopted. For the semiconductor layer 41 and cap layer 43, polysilicon may be adopted.

The memory pillar MP and eight interconnect layers 35 that serve as the word lines WL0 to WL7 constitute the memory cell transistors MC0 to MC7. Similarly, the memory pillar MP and two interconnect layers 35 that serve as the select gate lines SGD and SGS constitute the select transistors ST1 and ST2.

One interconnect layer 35 is provided for each of the select gate lines SGD and SGS in the example of FIG. 4, but multiple layers may be provided.

A contact plug CP is formed on the cap layer 43 to penetrate through the insulating layer 36, insulating layer 37, and insulating layer 34. An interconnect layer (not shown) that serves as a bit line BL is formed on the contact plug CP. For example, a metallic material such as W and TiN is adopted for this contact plug CP.

A slit SLT is formed to extend in the X direction with its bottom surface reaching the n+-type diffusion layer 33 so as to separate the interconnect layers 35 and insulating layer 37 in the Y direction. A conductive layer 44 is formed in the slit SLT with its side surface in contact with the insulating layer 36 and insulating layer 37 and its bottom surface in contact with the n+-type diffusion layer 33. The conductive layer 44 is electrically coupled to the n+-type diffusion layer 33 formed in the semiconductor substrate 30, and serves as a source line contact. The conductive layer 44 has a linear shape that extends in the X direction. The top surface of the conductive layer 44 is coupled to an interconnect layer (not shown), which serves as a source line SL. For the conductive layer 44, a semiconductor material such as polysilicon, a metallic material such as W, or a layered structure of these materials may be adopted.

1.2 Manufacturing Method of Memory Cell Array

A manufacturing method of the memory cell array 11 is explained with reference to FIGS. 5 to 9. FIGS. 5 to 9 show cross sectional views of the memory cell array 11 during the manufacturing steps thereof. According to the present embodiment, the method of forming interconnect layers 35 by forming a structure corresponding to the interconnect layers 35 with sacrifice layers and replacing the sacrifice layers with a conductive material (hereinafter referred to as "replace") is discussed.

As illustrated in FIG. 5, eleven insulating layers 34 and ten sacrifice layers 45, which correspond to the ten interconnect layers 35, are alternately stacked on the p-type well 32. For the sacrifice layers 45, SiN may be adopted. The sacrifice layers 45 are not limited to SiN, however. The sacrifice layers 45 may be formed of any material that can achieve sufficient selectivity in wet etching with respect to the insulating layer 34.

Next, a memory pillar MP is formed in such a manner as to have the bottom surface in contact with the p-type well 32. Specifically, the insulating layers 34 and sacrifice layers 45 are processed to form a hole corresponding to the memory pillar MP. Next, the block insulation film 38, charge storage layer 39, and tunnel insulation film 40 are sequentially deposited, and then the portions of the block insulation film 38, charge storage layer 39, and tunnel insulation film 40 are removed from the hole bottom. Thereafter, the semiconductor layer 41 and core layer 42 are sequentially deposited to fill in the hole. Then, the block insulation film 38, charge storage layer 39, tunnel insulation film 40, semiconductor layer 41, and core layer 42 are removed in portions on the topmost insulating layer 34. Here, part of the semiconductor layer 41 and core layer 42 is etched away from the top portion of the hole. Thereafter, a cap layer 43 is formed to fill in the top portion of the hole. The cap layer 43 on the topmost insulating layer 34 is removed.

Then, an insulating layer 34 is formed to cover the top surfaces of the memory pillars MP, and the surface is planarized.

Next, a slit SLT is formed to extend in the X direction, with its bottom surface reaching the n+-type diffusion layer 33.

As illustrated in FIG. 6, the sacrifice layers 45 are removed to form air gap AG. Specifically, when the sacrifice layers 45 are formed of SiN, portions of the sacrifice layers 45 exposed from the side surface of the slit SLT are etched away by wet etching with phosphoric acid (H3PO4).

Figure 7:
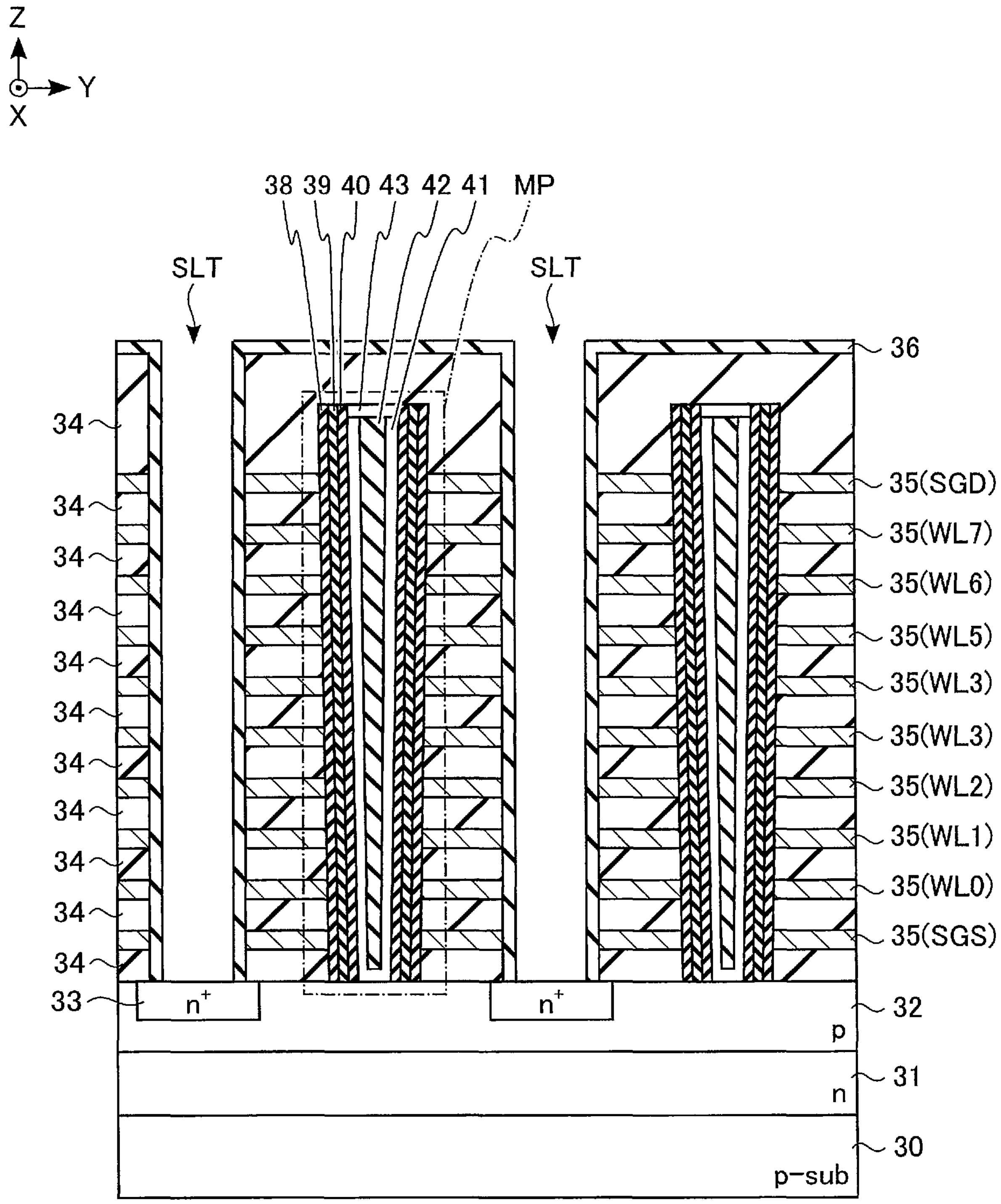

As illustrated in FIG. 7, TiN and W films are sequentially deposited to fill in the air gap AG. The W and TiN are removed from the inside of the slit SLT and in portions on the topmost insulating layer 34, resulting in interconnect layers 35 formed.

After forming an insulating layer 36, the portion of the insulating layer 36 is removed from the bottom portion of the slit SLT. Here, the portion of the insulating layer 36 on the topmost insulating layer 34 may also be removed together. That is, the insulating layer 36 will suffice as long as it is formed on the side surface of the slit SLT.

Figure 8:
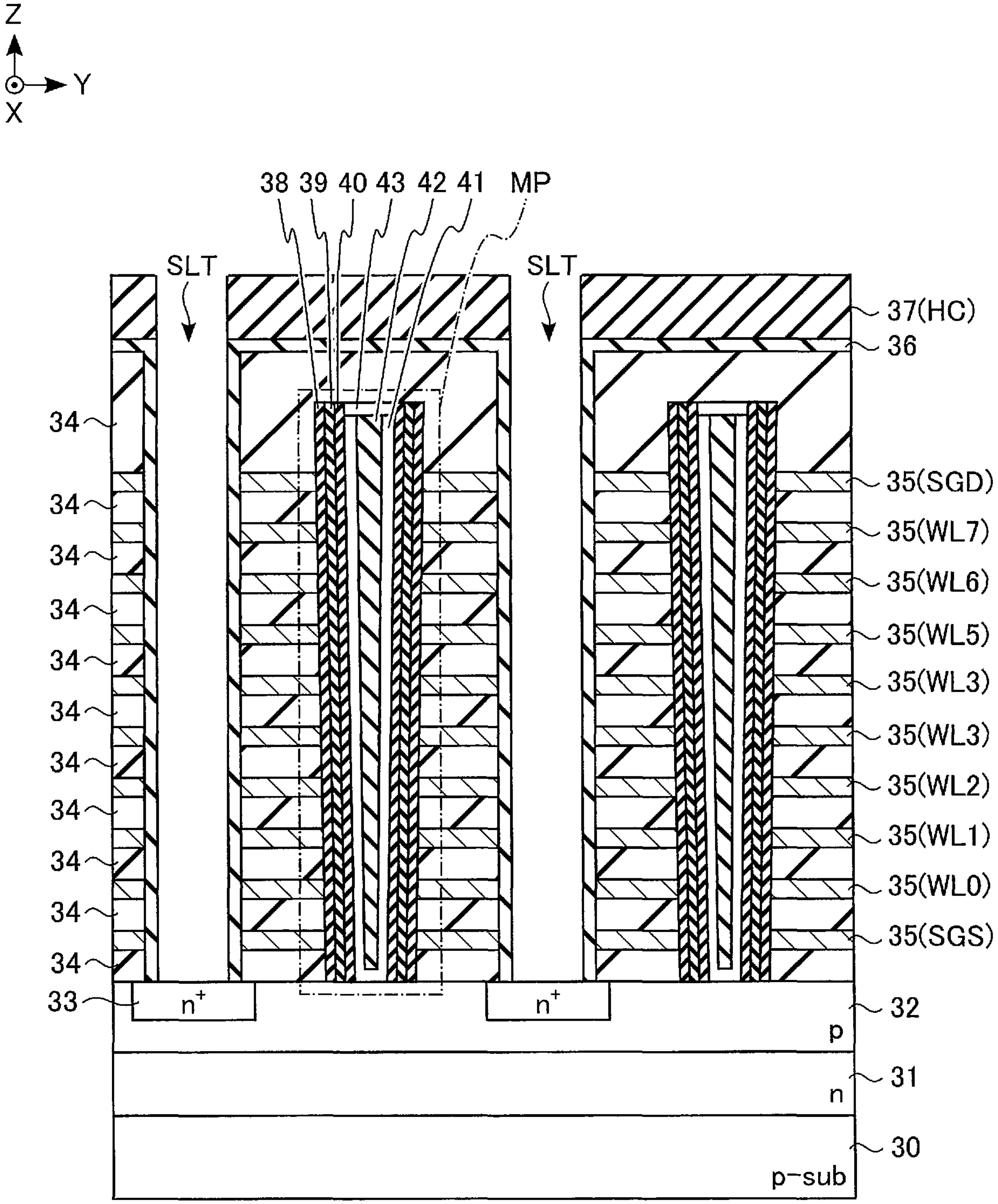

As illustrated in FIG. 8, an insulating layer 37 is formed. The SiN formed by sputtering exhibits low step coverage. Because of this, when the PVD-SiN is adopted for the insulating layer 37, PVD-SiN will be barely formed on the side surface or bottom surface of the slit SLT. As a result, the insulating layer 37 separated by slits SLT, or in other words, a high compressive stress film HC, is formed.

As illustrated in FIG. 9, a conductive layer 44 is formed to fill in the slit SLT. The slit SLT may not be entirely filled with the conductive layer 44, but may contain some voids. As illustrated in FIG. 4, after forming the insulating layer 34 to cover the conductive layer 44 and insulating layer 37, contact plugs CP are formed.

1.3 Advantageous Effects of Present Embodiment

With the structure according to the present embodiment, a semiconductor memory device that can improve yield is offered. This effect is now discussed in detail.

In consideration of the relationship between the film stress of the word lines WL and the warpage of the semiconductor substrate 30, the warpage of the semiconductor substrate 30 caused by the word lines WL is greater in the X direction and smaller in the Y direction when the word lines WL viewed from the Z direction are rectangular with their sides longer in the X direction and shorter in the Y direction. This tendency becomes more significant as the number of layers of the word lines WL increases in accordance with the higher integration of a three-dimensionally layered NAND flash memory. For instance, as the difference between the warpage of the semiconductor substrate 30 in the X direction and the warpage in the Y direction increases, so too does the susceptibility to failure during transport of the semiconductor substrate 30 in the manufacturing process of the semiconductor memory device. The warpage of the semiconductor substrate 30 also tends to create cracks in the insulating layers, lowering manufacturing yields.

In contrast, in the structure according to the present embodiment, a high compressive stress film HC, which is separated by the slits SLT in a manner similar to the word lines WL, is formed above the word lines WL. Since the metal adopted for the word lines WL has a tensile stress, providing the high compressive stress film HC can reduce the warpage of the semiconductor substrate 30 in the X direction, thereby reducing the difference between the warpage in the X direction and the warpage in the Y direction. This can inhibit manufacturing yields from decreasing.

Furthermore, in the structure of the present embodiment, the high compressive stress film HC is separated by the slits SLT, and therefore such a high compressive stress film HC would not adversely increase the warpage in the Y direction.

2. Second Embodiment

Next, the second embodiment is explained. The explanation of the second embodiment focuses on the manufacturing method of the memory cell array 11 that is different from the first embodiment. The following explanation mainly deals with the points that differ from the first embodiment.

2.1 Manufacturing Method of Memory Cell Array

The manufacturing method of the memory cell array 11 according to the present embodiment is explained with reference to FIGS. 10 to 14. The cross sectional views of FIGS. 10 to 14 show the manufacturing, steps of the memory cell array 11.

As illustrated in FIG. 10, after alternately depositing eleven insulating layers 34 and ten sacrifice layers 45 on the p-type well 32, memory pillars MP are formed in the same manner as the first embodiment illustrated in FIG. 5. Then, an insulating layer 34 is formed to cover the top surfaces of the memory pillars MP, and the surface is planarized.

Next, a semiconductor layer 46 may be formed as a high compressive stress film HC. For the semiconductor layer 46, amorphous silicon or polysilicon having a compressive stress of −300 MPa or greater is adopted. According to the present embodiment, the semiconductor layer 46 is adopted instead of PVD-SiN, in consideration of the "replace", but the semiconductor layer 46 is not a limitation. An insulating material, or a conductive material, may be adopted for the high compressive stress film HC. According to the present embodiment, a high compressive stress film HC is formed before the formation of slits SLT, and therefore the material for the high compressive stress film HC can be selected without taking the step coverage into consideration.

Figure 11:
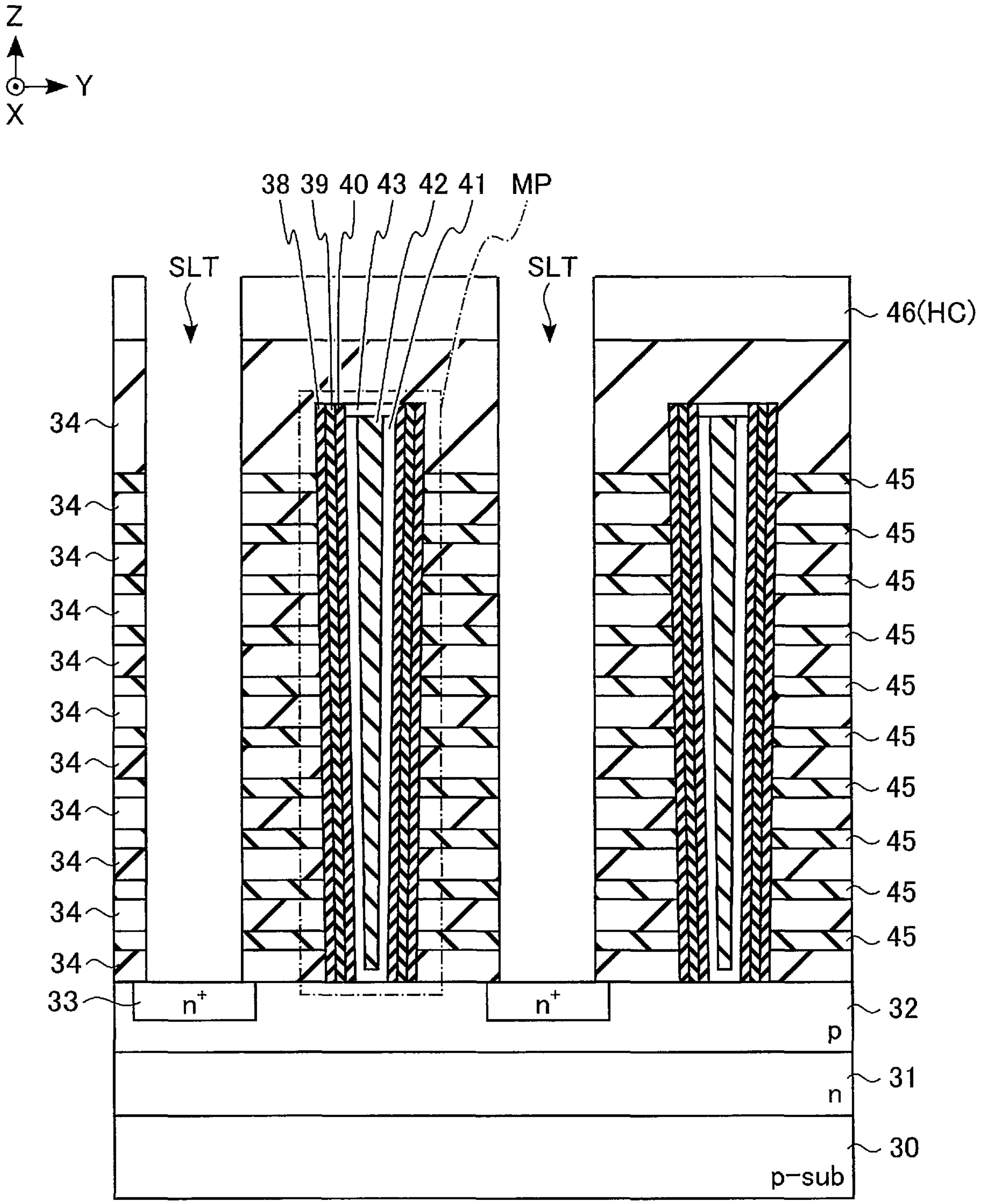

Next, as illustrated in FIG. 11, the semiconductor layer 46, insulating layers 34, and sacrifice layers 45 are processed to form slits SLT to extend in the X direction and to have a bottom surface reaching the p-type well 32.

As illustrated in FIG. 12, the sacrifice layers 45 are removed to form air gap AG, in the same manner as the first embodiment illustrated in FIG. 6.

As illustrated in FIG. 13, TiN and W films are sequentially formed to fill in the air gap AG. The W and TiN are removed in portions inside the slits SLT and on the semiconductor layer 46 resulting in interconnect layers 35 formed.

Next, an insulating layer 36 is formed, and then the portion of the insulating layer 36 is removed from the bottom portion of the slit SLT.

As illustrated in FIG. 14, conductive layers 44 are formed to fill in the slits SLT.

Next, an insulating layer 34 is formed, and then contact plugs CP are formed with their side surface covered by an insulating layer 47. For this insulating layer 47, SiO2 may be adopted.

2.2 Advantageous Effects of Present Embodiment

With the structure according to the present embodiment, the same advantageous effects as the first embodiment can be achieved.

3. Third Embodiment

The third embodiment is explained. According to the third embodiment, the high compressive stress film HC is further formed inside the slits SLT. The following explanation mainly deals with the points that differ from the first and second embodiments.

3.1 Cross-Sectional Structure of Memory Cell Array

The cross-sectional structure of the memory cell array 11 according to the present embodiment is explained with reference to FIG. 15.

As illustrated in FIG. 15, conductive layers 51 and 53 that function as a barrier metal, a conductive layer 52 that functions as a high compressive stress film HC, and a conductive layer 54 are formed inside each slit SLT. Specifically, the conductive layer 51 is formed in contact with the side surface and bottom surface of the slit SLT. The conductive layer 52 is formed with its side surface and bottom surface in contact with the conductive layer 51. The conductive layer 52 is formed to have a thickness in the Y direction that gradually decreases toward the opening of the slit SLT. The thickness of the conductive layer 52 is therefore smaller in the top portion than in the bottom portion. The conductive layer 53 is formed with its side surface and bottom surface in contact with the conductive layer 52. The conductive layer 54 is formed with its side surface and bottom surface in contact with the conductive layer 53 to fill in the slit SLT. The conductive layers 51 to 54 are electrically coupled to the n+-type diffusion layer 33 formed in the semiconductor substrate 30, and function as a source line contact.

For the conductive layer 51, a TiN-and-Ti layered structure may be adopted. For the conductive layer 52, N-introduced W may be adopted so as to serve as a high compressive stress film HC. For the conductive layer 53, TiN may be used. For the conductive layer 54, W may be used. The N content in the conductive layer 54 is smaller than in the conductive layer 52, and the conductive layer 54 may be N-free W.

The high compressive stress film HC formed inside the slit SLT is not limited to N-added W. This high compressive stress film HC does not always need to be formed up to the height to separate the insulating layer 37 in the slit SLT, and the high compressive stress film HC will be sufficient as long as it reaches at least a height where the slit SLT separates the interconnect layers 35 in the layered structure of the ten interconnect layers 35.

3.2 Manufacturing Method of Memory Cell Array

The manufacturing method of the memory cell array 11 according to the present embodiment will be explained with reference to FIGS. 16 to 19. FIGS. 16 to 19 show cross sectional views of the memory cell array 11 during the manufacturing steps thereof. The filling of the slit SLT is explained in detail below.

As illustrated in FIG. 16, the insulating layer 37 is formed in the same manner as the first embodiment in FIGS. 5 to 8.

Next, TiN and Ti are deposited as a conductive layer 51. Thereafter, the conductive layer 52 is formed. Specifically, W is formed to have a thickness that would not fill up the slit. SLT. Then, a thermal treatment may be conducted in an ammonia (NH3) atmosphere. With this, N is diffused into the W film, thereby forming a high compressive stress film HC.

As illustrated in FIG. 17, the conductive layer 52 is removed in portions on the insulating layer 37. During this, the conductive layer 52 is also removed in portions near the opening of the slit SLT. As a result, the thickness of the conductive layer 52 in the Y direction decreases gradually toward the opening of the slit SLT.

As illustrated in FIG. 18, TiN is formed as a conductive layer 53, then W is formed as a conductive layer 54, and the slit SLT is filled.

Figure 19:
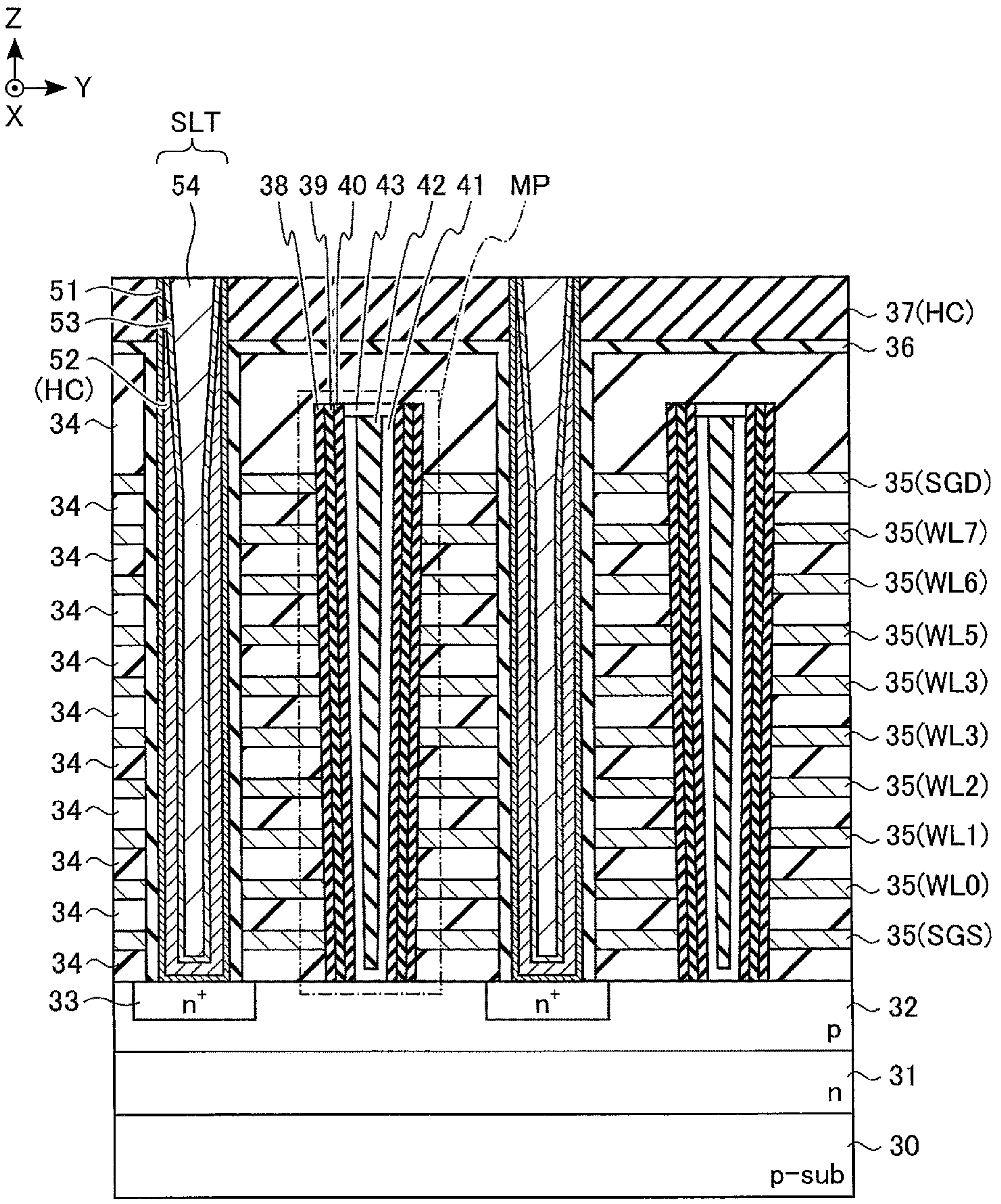

As illustrated in FIG. 19, the conductive layers 51 to 54 are removed in portions on the insulating layer 37. After forming an insulating layer 34, a contact plug CP is formed, as illustrated in FIG. 15.

3.3 Advantageous Effects of Present Embodiment

With the structure according to the present embodiment, the same advantageous effects as the first embodiment can be achieved.

Furthermore, in the structure according to the present embodiment, a high compressive stress film HC is formed in the slit SLT, which can reduce more the difference between the warpage of the semiconductor substrate 30 in the X direction and the warpage in the Y direction.

4. Fourth Embodiment

Next, the fourth embodiment is explained. The explanation of the fourth embodiment focuses on the cross-sectional structure of the memory cell array 11 that is different from the first to third embodiments.

4.1 Cross-Sectional Structure of Memory Cell Array

The cross-sectional structure of the memory cell array 11 according to the present embodiment will be explained with reference to FIG. 20.

As illustrated in FIG. 20, an insulating layer 60 is formed on the semiconductor substrate 30. For the insulating layer 60, SiO2 may be adopted.

An interconnect layer 61 is formed on the insulating layer 60 to function as a source line SL. The interconnect layer 61 may be formed of a conductive material. For example, a semiconductor material such as an n-type semiconductor or p-type semiconductor, or a metallic material, may be adopted. A circuit such as a row decoder 12 or sense amplifier 13 may be provided in the region of the insulating layer 60, or in other words, between the semiconductor substrate 30 and the interconnect layer 61.

The structure of the interconnect layers 35, insulating layer 37, memory pillars MP, and contact plugs CP above the interconnect layer 61 is the same as the first embodiment.

The structure according to the present embodiment does not need to include a source line contact, and therefore an insulating layer 36 is formed on the side surface and bottom surface of the slit SLT. A semiconductor layer 62 may be formed as a high compressive stress film HC inside the slit SLT. That is, the insulating layer 36 is in contact with the two side surfaces of the semiconductor layer 62 facing the Y direction and the bottom surface thereof. For the semiconductor layer 62, amorphous silicon or polysilicon having a compressive stress of absolute value of 300 MPa (i.e., −300 MPa) or greater is adopted. An insulating material, or a conductive material, may be adopted for the high compressive stress film HC in the slit SLT.

Furthermore, as in the third embodiment, the height of the high compressive stress film HC in the slit SLT is sufficient as long as the high compressive stress film HC reaches a height where the slit SLT separates the interconnect layers 35 in the layered structure of at least ten interconnect layers 35. The high compressive stress film HC may not be provided in the slit SLT.

4.2 Advantageous Effects of Present Embodiment

The structure according to the present embodiment can achieve the same effects as the first to third embodiments.

5. Exemplary Modifications, Etc.

According to the configuration of the above-described embodiments, a semiconductor memory device comprising: a plurality of first interconnect layers (WL) extending in a first direction (X direction) that is substantially parallel to a semiconductor substrate; a plurality of second interconnect layers (WL) extending in the first direction, and being separate from and adjacent to the first interconnect layers in a second direction (Y direction) that is substantially parallel to the semiconductor substrate and orthogonal to the first direction; a first memory pillar (MP) extending through the first interconnect layers in a third direction that is substantially vertical to the semiconductor substrate; a second memory pillar (MP) extending through the second interconnect layers and extending in the third direction; a first film (37) above the first interconnect layers, the first film having a planar shape corresponding to the first interconnect layers and extending in the first direction; and a second film (37) above the second interconnect layers, second film being separate from the first film in the second direction, having a planar shape corresponding to the second interconnect layers and extending in the first direction. The first and second films have a compressive stress higher than a silicon oxide film.

By adopting the above embodiment, yield can be improved for semiconductor memory devices.

The present embodiments are not limited to the above explained forms, but various modifications can be made.

The term "coupling" in the above descriptions includes a state of being indirectly coupled, for example with a transistor, resistor or any other component interposed in between.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a plurality of first interconnect layers extending in a first direction that is substantially parallel to a semiconductor substrate;

a plurality of second interconnect layers extending in the first direction, and being separate from and adjacent to the first interconnect layers in a second direction that is substantially parallel to the semiconductor substrate and orthogonal to the first direction;

a first memory pillar extending through the first interconnect layers in a third direction that is substantially vertical to the semiconductor substrate;

a second memory pillar extending through the second interconnect layers in the third direction;

a first film above the first interconnect layers, the first film having a planar shape corresponding to the first interconnect layers and extending in the first direction;

a second film above the second interconnect layers, the second film being separate from the first film in the second direction, having a planar shape corresponding to the second interconnect layers and extending in the first direction; and a third film extending in the first direction between the first interconnect layers and the second interconnect layers, and having a compressive stress higher than a silicon oxide film, wherein the first and second films have a compressive stress higher than a silicon oxide film.

2. The device according to claim 1, wherein:

the first and second films include one of amorphous silicon, polysilicon, silicon nitride formed by physical vapor deposition (PVD), and nitrogen-containing tungsten, and the third film includes one of amorphous silicon, polysilicon, and silicon nitride formed by PVD.

3. The device according to claim 1, further comprising:

a first contact plug on the first memory pillar, the first contact plug extending through the first film in the third direction.

4. The device according to claim 3, further comprising:

a third insulating layer between the first film and the first contact plug.

5. The device according to claim 1, wherein:
the third film is further provided between the first film and the second film.

6. The device according to claim 1, wherein:
the third film includes nitrogen-containing tungsten.

7. The device according to claim 6, wherein:
the third film is electrically coupled to a diffusion layer formed in the semiconductor substrate.

8. The device according to claim 6, further comprising:
a fourth insulating layer between the third film and the first interconnect layers; and
a fifth insulating layer between the third film and the second interconnect layers.

9. The device according to claim 6, wherein:
a thickness of the third film in a portion near a top of the third film is smaller than a thickness of the third film in a portion near a bottom of the third film.

10. The device according to claim 9, further comprising:
a second conductive layer having a side surface and a bottom surface that are in contact with the third film, and extending in the first direction.

11. The device according to claim 10, wherein:
the second conductive layer includes tungsten having a smaller content of nitrogen than a content of nitrogen in the nitrogen-containing tungsten of the third film.

12. The device according to claim 11, wherein:
the second conductive layer further includes a barrier metal having a side surface and a bottom surface that are in contact with the third film, and the side surface and bottom surface of the tungsten having the smaller content of nitrogen are in contact with the barrier metal.

13. The device according to claim 1, further comprising:
a sixth insulating layer extending in the first direction and being in contact with two side surfaces of the third film facing the second direction and the bottom surface of the third film.

14. The device according to claim 1, wherein:
the first and second films have a compressive stress of an absolute value of 300 MPa or greater.

15. The device according to claim 1, wherein:
the first film is provided above the first memory pillar, and
the second film is provided above the second memory pillar.

16. The device according to claim 1, wherein:
each of the first and second memory pillars includes a charge storage layer and a semiconductor layer.

17. A semiconductor memory device comprising:
a plurality of first interconnect layers extending in a first direction that is substantially parallel to a semiconductor substrate;
a plurality of second interconnect layers extending in the first direction, and being separate from and adjacent to the first interconnect layers in a second direction that is substantially parallel to the semiconductor substrate and orthogonal to the first direction;
a first memory pillar extending through the first interconnect layers in a third direction that is substantially vertical to the semiconductor substrate;
a second memory pillar extending through the second interconnect layers in the third direction;
a first film above the first interconnect layers, the first film having a planar shape corresponding to the first interconnect layers and extending in the first direction;
a second film above the second interconnect layers, the second film being separate from the first film in the second direction, having a planar shape corresponding to the second interconnect layers and extending in the first direction;
a first conductive layer between the first interconnect layers and the second interconnect layers and between the first film and the second film, the first conductive layer extending in the first direction and being electrically coupled to a diffusion layer formed in the semiconductor substrate;
a first insulating layer between the first interconnect layers and the first conductive layer; and
a second insulating layer between the second interconnect layers and the first conductive layer,
wherein the first and second films have a compressive stress higher than a silicon oxide film.

18. The device according to claim 17, wherein:
the first insulating layer is further provided between the first film and the first conductive layer, and
the second insulating layer is further provided between the second film and the first conductive layer.

19. The device according to claim 17, wherein:
the first and second films include one of amorphous silicon, polysilicon, silicon nitride formed by physical vapor deposition (PVD), and nitrogen-containing tungsten.

20. The device according to claim 17, wherein:
the first and second films have a compressive stress of an absolute value of 300 MPa or greater.

* * * * *